(12) United States Patent
Gu et al.

(10) Patent No.: US 12,057,713 B2
(45) Date of Patent: Aug. 6, 2024

(54) WIRELESS POWER TRANSMITTING DEVICE INCLUDING IMPEDANCE MATCHING CIRCUIT AND WIRELESS POWER TRANSMISSION METHOD

(71) Applicant: SAMSUNG ELECTRONICS CO., LTD., Suwon-si (KR)

(72) Inventors: Beomwoo Gu, Suwon-si (KR);
Daehyun Kim, Suwon-si (KR);
Jaeseok Park, Suwon-si (KR);
Jaehyun Park, Suwon-si (KR);
Sungku Yeo, Suwon-si (KR);
Jeongman Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 42 days.

(21) Appl. No.: 17/954,825

(22) Filed: Sep. 28, 2022

(65) Prior Publication Data
US 2023/0101152 A1 Mar. 30, 2023

Related U.S. Application Data

(63) Continuation of application No. PCT/KR2022/014478, filed on Sep. 27, 2022.

(30) Foreign Application Priority Data

Sep. 28, 2021 (KR) ......................... 10-2021-0127852

(51) Int. Cl.
*H02J 50/12* (2016.01)
*H02M 1/12* (2006.01)
(Continued)

(52) U.S. Cl.
CPC ............. *H02J 50/12* (2016.02); *H02M 1/126* (2013.01); *H02M 7/4818* (2021.05); *H03H 7/40* (2013.01); *H03H 11/30* (2013.01)

(58) Field of Classification Search
CPC ........... H02J 50/12; H02J 50/10; H01F 38/14; H02M 7/4815; H02M 7/4818; H02M 1/126; B60L 53/12; H03H 11/28; H03H 11/30

See application file for complete search history.

(56) References Cited

U.S. PATENT DOCUMENTS

2009/0127937 A1 5/2009 Widmer et al.
2010/0084918 A1 4/2010 Fells et al.
(Continued)

FOREIGN PATENT DOCUMENTS

JP 2013-251974 A 12/2013
KR 20110112435 A 10/2011
(Continued)

OTHER PUBLICATIONS

International Search Report mailed Jan. 2, 2023 for PCT/KR2022/014478.

*Primary Examiner* — Ryan Johnson
(74) *Attorney, Agent, or Firm* — CANTOR COLBURN LLP

(57) ABSTRACT

A wireless power transmitting device includes: a transistor configured to output a signal corresponding to a set operating frequency, based on an input signal and a driving voltage; a matching circuit connected with the transistor; a transmission coil connected with the matching circuit; an LC resonance circuit connected in parallel between the transistor and the matching circuit and configured to transfer a signal corresponding to at least one harmonic frequency of the operating frequency; and an impedance sensing circuit connected with the LC resonance circuit and configured to sense a load impedance of the wireless power transmitting device based on the signal corresponding to the at least one harmonic frequency transferred through the LC resonance circuit. The matching circuit is configured to provide imped- (Continued)

ance matching with the sensed load impedance by adjusting an impedance of the matching circuit or an impedance of the transmission coil.

20 Claims, 22 Drawing Sheets

(51) Int. Cl.
*H02M 7/48* (2007.01)
*H03H 7/40* (2006.01)
*H03H 11/30* (2006.01)

(56) References Cited

U.S. PATENT DOCUMENTS

| | | |
|---|---|---|
| 2010/0217553 A1 | 8/2010 | Von Novak et al. |
| 2011/0285349 A1 | 11/2011 | Widmer et al. |
| 2012/0056487 A1 | 3/2012 | Choi et al. |
| 2014/0084701 A1 | 3/2014 | Bae |
| 2014/0217831 A1 | 8/2014 | Hyoung et al. |
| 2015/0061579 A1* | 3/2015 | Katsunaga ............ H02J 50/90 320/108 |
| 2015/0069854 A1 | 3/2015 | Kim et al. |
| 2016/0221441 A1 | 8/2016 | Hall et al. |
| 2017/0141615 A1 | 5/2017 | Moon et al. |
| 2017/0237340 A1 | 8/2017 | Long et al. |
| 2017/0271924 A1* | 9/2017 | Mao ................... H03M 1/1245 |
| 2017/0288461 A1 | 10/2017 | Konanur et al. |
| 2019/0027964 A1 | 1/2019 | Yabumoto |
| 2019/0207570 A1 | 7/2019 | Govindaraj |
| 2022/0006333 A1 | 1/2022 | Yeo et al. |

FOREIGN PATENT DOCUMENTS

| | | |
|---|---|---|
| KR | 20120023865 A | 3/2012 |
| KR | 20120134032 A | 12/2012 |
| KR | 20130087708 A | 8/2013 |
| KR | 10-2014-0101028 A | 8/2014 |
| KR | 10-2015-0029799 A | 3/2015 |
| KR | 10-2017-0009683 A | 1/2017 |
| KR | 10-1735776 B1 | 5/2017 |
| KR | 20200010601 A | 1/2020 |
| KR | 10-2020-0114847 A | 10/2020 |
| WO | 2009060264 A1 | 5/2009 |

* cited by examiner

WIRELESS POWER TRANSMITTING DEVICE INCLUDING IMPEDANCE MATCHING CIRCUIT AND WIRELESS POWER TRANSMISSION METHOD

CROSS-REFERENCE TO RELATED APPLICATION(S)

This application is a continuation application, claiming priority under § 365(c), of an International application No. PCT/KR2022/014478, filed on Sep. 27, 2022, which is based on and claims the benefit of a Korean patent application number 10-2021-0127852, filed on Sep. 28, 2021, in the Korean Intellectual Property Office, the disclosure of which is incorporated by reference herein in its entirety.

TECHNICAL FIELD

Various embodiments of the disclosure relate to a wireless power transmitting device including an impedance matching circuit and a wireless power transmission method.

BACKGROUND ART

Wireless charging technology adopts wireless power transmission/reception. For example, wireless charging may automatically charge the battery of a mobile phone by simply placing the mobile phone on a wireless power transmitter (e.g., a charging pad) without connection via a separate charging connector. Wireless communication technology reduces the need for a connector for supplying power to electronics, thus providing enhanced waterproofing, and also requires no wired charger to thus provide better portability.

As wireless charging technology develops, there is ongoing research for methods for charging other various electronic devices (wireless power receiving device) by supplying power to the other electronic devices by an electronic device (wireless power transmitting device). For example, wireless charging comes in a few different types, such as of electromagnetic induction using a coil, resonance, and radio frequency (RF)/microwave radiation that converts electrical energy into microwaves and transfers the microwaves.

For example, wireless charging techniques using electromagnetic induction or resonance are recently being widely adopted for electronic devices, such as smartphones. For example, if a power transmitting unit (PTU) (e.g., a wireless power transmitter) and a power receiving unit (PRU) (e.g., a smartphone or a wearable electronic device) come in contact or close to each other within a predetermined distance, power may be transferred to the power receiving unit by an electromagnetic induction or electromagnetic resonance method between the transmission coil or resonator of the power transmitting unit and the reception coil or resonator of the power receiving unit, and the battery included in the power receiving unit may be charged with the transferred power.

The wireless power transmitting device (or power transmitting unit) may include an inverter and a resonator. The inverter is a device that converts direct current (DC) power into alternating current (AC) power. To increase the efficiency of the inverter, various matching circuits may be connected to an output terminal of the inverter.

As an example of the inverter, there is a class E inverter (or a class E power amplifier (PA)). Since the class E inverter operates under a zero-voltage switching (ZVS) condition and a zero-derivative voltage switching (ZDS) condition, there is an advantage in that it may be efficiently operated at a high (e.g., 1 MHz or higher) switching frequency.

To increase the efficiency of the class E inverter, there is used a class $EF_n$ (where n is an integer of 2 or more) inverter or a class $E/F_n$ inverter adding a resonant network in parallel to the load network.

DETAILED DESCRIPTION OF THE INVENTION

Technical Problem

The class $EF_2$ inverter has a form in which an LC series resonance circuit is connected in parallel to the load network of the class E inverter. The load impedance $Z_L$ may be varied depending on the distance between a metal (e.g., receiving terminal) and the wireless power transmitting device (or the class $EF_2$ inverter of the wireless power transmitting device), so that the efficiency of the class $EF_2$ inverter may be deteriorated.

For example, as the distance between the metal (e.g., receiving terminal) and the wireless power transmitting device (or the class $EF_2$ inverter of the wireless power transmitting device) decreases, the load impedance $Z_L$ may increase. If the load impedance $Z_L$ of the wireless power transmitting device increases, the efficiency of the wireless power transmitting device may relatively decrease.

Technical Solution

According to various embodiments of the disclosure, there may be provided a wireless power transmitting device including an impedance matching circuit and a wireless power transmission method, which may sense the load impedance by sensing a signal corresponding to a harmonic frequency through an LC resonance circuit connected in parallel with a transistor outputting a signal corresponding to an operating frequency.

According to various embodiments of the disclosure, there may be provided a wireless power transmitting device including an impedance matching circuit and a wireless power transmission method, which may sense the load impedance by sensing a signal corresponding to a harmonic frequency through an LC resonance circuit connected in parallel with a transistor outputting a signal corresponding to an operating frequency and adjust the impedance based on the sensed load impedance.

To achieve the foregoing or other aspects, a wireless power transmitting device according to an embodiment may comprise a transistor configured to output a first signal corresponding to a set operating frequency, based on an input signal and a driving voltage; a matching circuit connected with the transistor; a transmission coil connected with the matching circuit; an LC resonance circuit connected in parallel between the transistor and the matching circuit and configured to transfer a second signal corresponding to at least one harmonic frequency of the operating frequency to the transmission coil; and an impedance sensing circuit connected with the LC resonance circuit and configured to sense a load impedance of the wireless power transmitting device based on the second signal corresponding to the at least one harmonic frequency transferred through the LC resonance circuit. The matching circuit is configured to provide impedance matching with the sensed load impedance by adjusting an impedance of the matching circuit or an impedance of the transmission coil To achieve the foregoing or other aspects, a wireless power transmission method of a wireless power transmitting device according to an embodiment may comprise: outputting a first signal corresponding to a set operating frequency, based on an input signal and a driving voltage, by a transistor; transferring a second signal corresponding to at least one harmonic frequency of the operating frequency, provided by an LC resonance circuit connected in parallel between the transistor and a matching circuit; forming a magnetic field based on the second signal, by a transmission coil; sensing a load impedance of the wireless power transmitting device based on the second signal corresponding to the at least one harmonic frequency transferred through the LC resonance circuit, by an impedance sensing circuit connected with the LC resonance circuit, and providing impedance matching with the sensed load impedance by adjusting an impedance of the matching circuit or an impedance of the transmission coil.

Advantageous Effects

According to various embodiments, the wireless power transmitting device and the wireless power transmission method may sense the load impedance from the signal corresponding to the harmonic frequency and adjust the impedance based on the sensed load impedance, thereby effectively preventing deterioration of charging efficiency according to variation in distance from the metal (e.g., wireless power receiving device).

MODE FOR CARRYING OUT THE INVENTION

Hereinafter, embodiments of the present invention are described in detail with reference to the accompanying drawings. It should be noted that the same element denotations are used to refer to the same elements throughout the specification. When making the gist of the present disclosure unclear, the detailed description of known functions or configurations is skipped.

Figure 1:
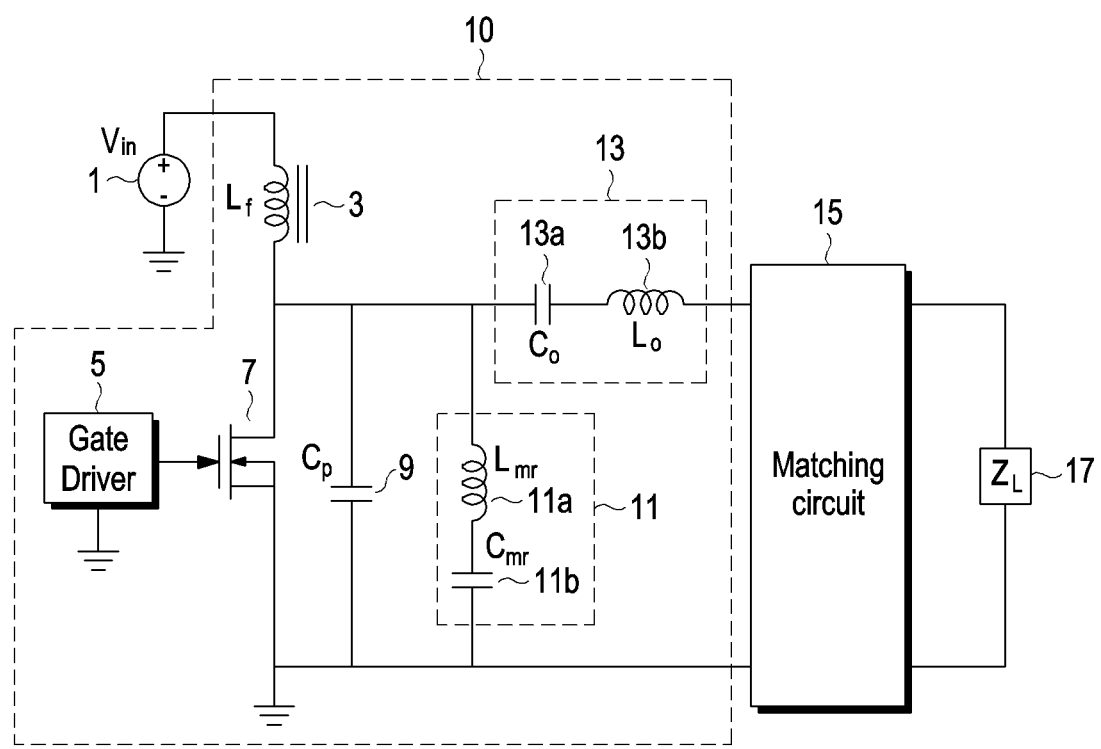
FIG. 1 is a circuit diagram illustrating a wireless power transmitting device according to various embodiments of the disclosure.

FIG. 1 is a circuit diagram illustrating a wireless power transmitting device according to various embodiments. Referring to FIG. 1, a wireless power transmitting device may include an inverter (e.g., an $EF_2$ inverter 10), a matching circuit 15, and a resonator. According to various embodiments, the $EF_2$ inverter may include an RF choke inductor 3 ($L_f$), a gate driver 5, a transistor 7, a shunt capacitor 9 ($C_p$), a first LC resonance circuit 11, and a second LC resonance circuit 13.

The transistor 7 may receive a DC voltage $V_{in}$, as a driving voltage, from an input power source 1 and operate using the driving voltage. The transistor 7 may receive a pulsed (e.g., square wave) input signal through the input terminal (e.g., gate) from a gate driver 5, and transistor 7 may turn on or off based on the pulsed input signal. The transistor 7 may include a metal oxide semiconductor field effect transistor ("MOSFET").

The RF choke inductor 3 may cut off transfer of a radio frequency (RF) signal from the input power source 1 to the transistor 7 so that only DC current is transferred to the transistor 7.

The shunt capacitor 9 may be connected in parallel with the transistor 7 and be discharged or charged while the transistor 7 is on or off. The shunt capacitor 9 may be a separate capacitor from the transistor 7 and may be the internal capacitance (e.g., the drain-source capacitance) of the transistor 7.

An RF signal (or RF power) may be generated based on the turn-on or off of the transistor 7 by receiving an input signal from the gate driver 5. The generated RF signal may be a signal having an operating frequency corresponding to the input signal input from the gate driver 5 to the gate of the transistor 7. For example, when the wireless power transmitting device transmits wireless power according to a resonance scheme standard, the operating frequency may be 6.78 megahertz (MHz), but the operating frequency is not limited thereto. The RF signal or RF power may be transferred to the first LC resonance circuit 11 and/or the second LC resonance circuit 13 through the output terminal of the transistor 7. More specifically, if the transistor 7 is turned on (e.g., if the transistor 7 is saturated), the transistor 7 may be electrically shorted and be interpreted as a short circuit for the ground connected with the source, and the voltage of the output terminal of the transistor 7 may be interpreted as 0. As the transistor 7 is turned on, the current flowing from the RF choke inductor 3 to the transistor 7 may gradually increase. Thereafter, if the transistor 7 is turned off, the current flowing from the RF choke inductor 3 may be supplied to the shunt capacitor 9 and, as the shunt capacitor 9 is gradually charged, the voltage at the output terminal of the transistor 7 (e.g., the voltage between the opposite terminals of the shunt capacitor 9) may increase as it reaches the maximum value. Thereafter, as the shunt capacitor 9 is gradually discharged, current flows from the shunt capacitor 9 through the output terminal of the transistor 7 to the first LC resonance circuit 11 and/or the second LC resonance circuit 13, so that the voltage between the opposite terminals of the shunt capacitor 9 may gradually decrease. The transistor 7, the shunt capacitor 9, and the input signal may be set so that before the transistor 7 turns off and then turns back on (e.g., before current starts to flow again from the RF choke inductor 3 to the transistor 7), the voltage at the output terminal of the transistor 7 (e.g., the voltage between the opposite terminals of the shunt capacitor 9 or the drain-source voltage of the transistor 7) may gradually decrease to 0, and the variation in the reduction of the voltage at the output terminal of the transistor 7 is 0. Thereafter, if the transistor 7 is turned back on, the current flowing from the RF choke inductor 3 may be supplied to the transistor 7 and, while the transistor 7 is on, the voltage at the output terminal of the transistor 7 may remain 0. As described above, while the transistor 7 is in an on state, the voltage at the output terminal of the transistor 7 is 0 and, while the transistor 7 is in an off state, the current flowing from the RF choke inductor 3 is supplied to the shunt capacitor 9, so that the current flowing from the RF choke inductor 3 to the transistor 7 is 0 (in other words, since the period during which the voltage at the output terminal of the transistor 7 is not zero (non-zero) does not overlap the period during which the drain-source current is not zero). Thus, the power consumed from the transistor 7 may be ideally zero. However, in a non-ideal case, since the transistor 7 generates RF power by being turned on or off, the generated RF power has a second and higher harmonic frequency components, as well as the desired frequency component (e.g., the fundamental component of the operating frequency). The duty cycle of the transistor 7 may be set to, e.g., 50 percentages (%), based on the input signal.

The first LC resonance circuit 11 may be connected in parallel with the transistor 7. The first LC resonance circuit 11 may include a first inductor 11*a* (e.g., a coil) (of which value is $L_{mr}$) and a first capacitor 11*b* (of which value is $C_{mr}$) connected in series with each other. The first inductor 11*a* and the first capacitor 11*b* may have proper element values that allow the resonant frequency of the first LC resonance circuit 11 to correspond to the second harmonic frequency ($2f_s$) of the operating frequency ($f_s$) of the input signal. The first LC resonance circuit 11 may be electrically equivalent to a short circuit at the second harmonic frequency ($2f_s$). The first LC resonance circuit 11 may be operated as a second harmonic filter (e.g., a band-stop filter) that prevents the second harmonic component of the RF power supplied by the transistor 7 from being transferred to the second LC resonance circuit 13 by being electrically shorted at the second harmonic frequency ($2f_s$). Here, the "harmonic frequency" is a frequency of n times of the operating frequency, and n is a natural number equal to or more than 2.

The second LC resonance circuit 13 may be connected in series to the output terminal of the transistor 7. The second LC resonance circuit 13 may include a second capacitor 13*a* ($C_o$) and a second inductor 13*b* ($L_o$) connected in series with each other. The second capacitor 13*a* and the second inductor 13*b* may have proper element values that allow the resonant frequency of the second LC resonance circuit 13 to correspond to the operating frequency ($f_s$) of the input signal (e.g., to correspond to the fundamental frequency (or the first harmonic frequency) ($f_s$). The second LC resonance circuit 13 may be electrically equivalent to a short circuit at the first harmonic frequency ($f_s$). The second LC resonance circuit 13 may be operated as a band-pass filter (or low-pass filter) that passes the fundamental component (or first harmonic component) (e.g., the component corresponding to the operating frequency) of the RF power provided by the transistor 7 by being electrically shorted at the first harmonic frequency ($f_s$).

The matching circuit 15 may be connected in series to the second LC resonance circuit 13. The matching circuit 15 may provide impedance matching that allows the output impedance (e.g., the impedance to the second LC resonance circuit 13) to match the impedance of the load 17 ($Z_L$). The matching circuit 15 may include, e.g., at least one low-pass filter and/or a band-stop filter, and the low-pass filter may include at least one capacitor.

The load 17 may include at least one hardware component (e.g., a circuit element) that receives the RF power generated by the $EF_2$ inverter 10 or receives the RF power and operates using the RF power. For example, the load 17 may include a hardware component (e.g., a transmission coil) of the wireless power transmitting device (e.g., the electronic device) including the $EF_2$ inverter 10 and/or a receiving device (e.g., the wireless power receiving device or power receiving unit) receiving power from the magnetically coupled electronic device (i.e., the wireless power transmitting device).

According to a comparative example, if the metal (e.g., power transmitting unit) approaches the $EF_2$ inverter 10 or the wireless power transmitting device including the $EF_2$ inverter 10, the coupling therebetween may increase, and the impedance $Z_L$ of the load 17 may increase, so that the efficiency of the $EF_2$ inverter 10 or the wireless power transmitting device may be deteriorated.

Figure 2:
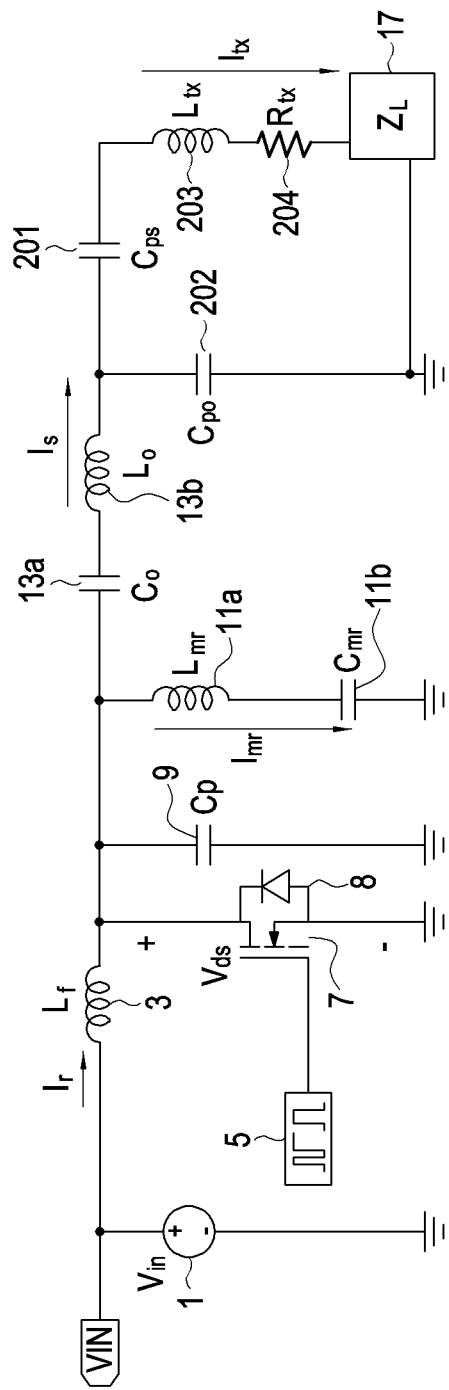
FIG. 2 is a circuit diagram illustrating a wireless power transmitting device according to various embodiments of the disclosure.
Figure 3:
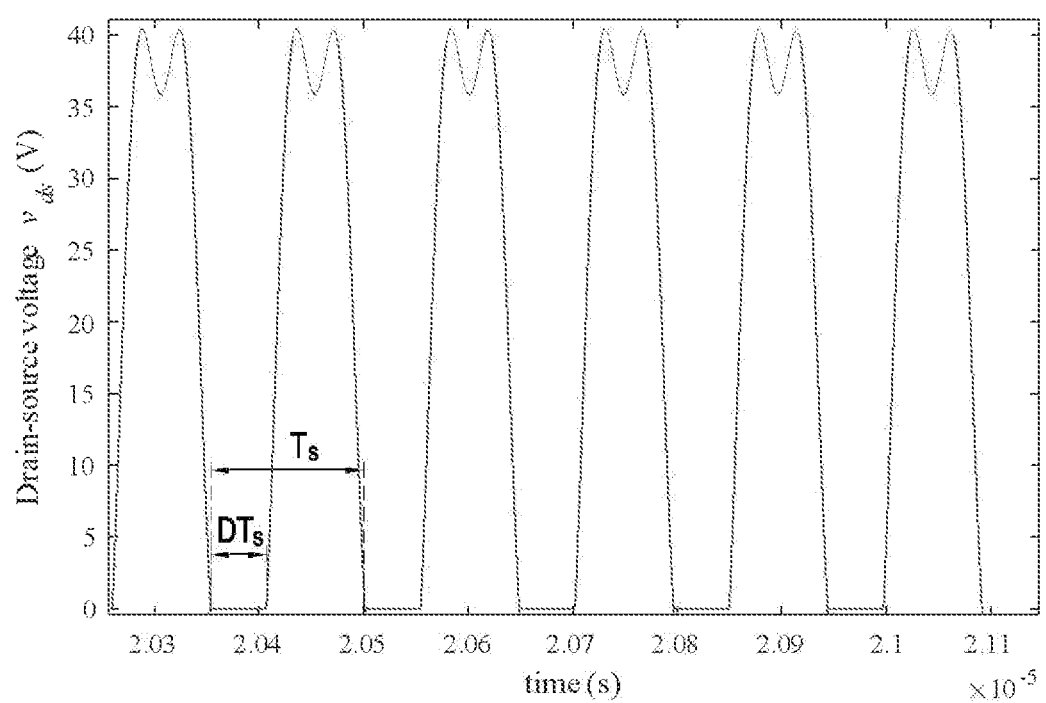
FIG. 3 is a graph illustrating a switching waveform of a transistor according to various embodiments of the disclosure.

FIG. 2 is a circuit diagram illustrating a wireless power transmitting device according to various embodiments of the disclosure. According to various embodiments, the current flowing through, or voltage applied to, each element or component may be simulated by modeling the circuit of the wireless power transmitting device of FIG. 1, as shown in FIG. 2. Referring to FIG. 2, a first diode 8 may be connected between the drain and source of the transistor 7, and the voltage $V_{ds}$ applied between the drain and source of the transistor 7 may be measured as shown in FIG. 3. The voltage $V_{ds}$ applied between the drain and source of the transistor 7 as shown in FIG. 3 may be a waveform measured during a predetermined time after a time (e.g., $1\times10^{-5}$ s) when the transistor 7 is stabilized after first driven. For example, the waveform may have a period of $T_s$ as shown in FIG. 3. Referring to FIG. 3, in the interval (e.g., $DT_s$ interval) corresponding to the on state of the transistor 7 in one $T_s$ period, the voltage $V_{ds}$ applied between the drain and source of the transistor 7 may be 0 or be close to 0, and in the interval corresponding to the off state of the transistor 7, the voltage $V_{ds}$ applied between the drain and source of the transistor 7 may be close to 35 to 40 voltages (V). The graph of FIG. 4A may be obtained by enlarging the graph of FIG. 3 in one $T_s$ period and taking 100 samples in the corresponding period.

Figure 4A:
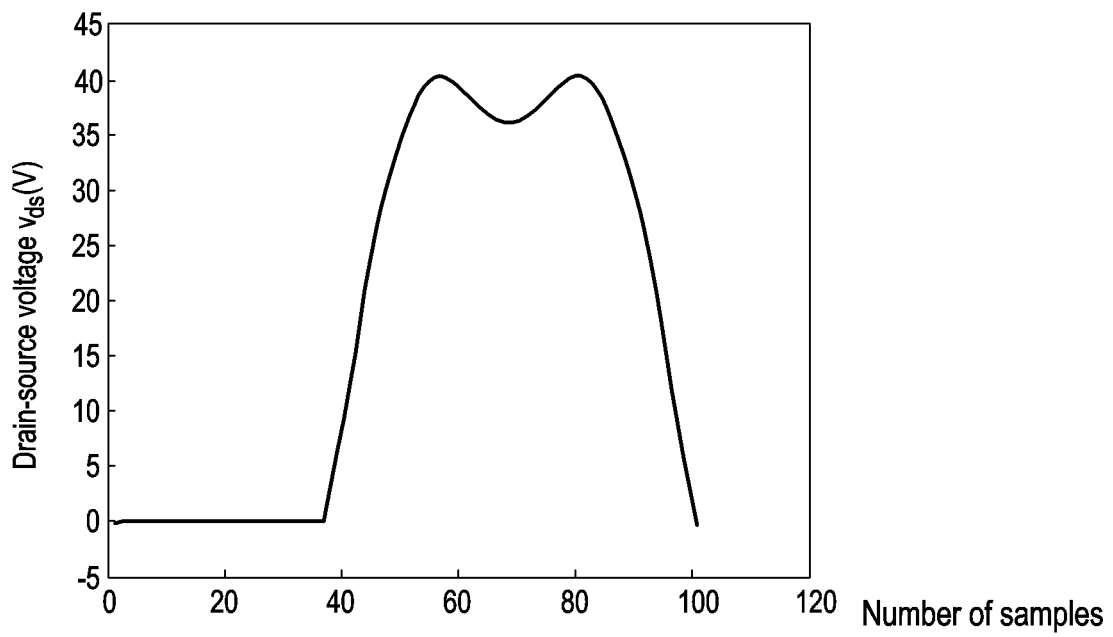
FIGS. 4A, 4B, 4C, 4D, and 4E are graphs illustrating a waveform measured at each portion of a wireless power transmitting device according to various embodiments of the disclosure.
Figure 4B:
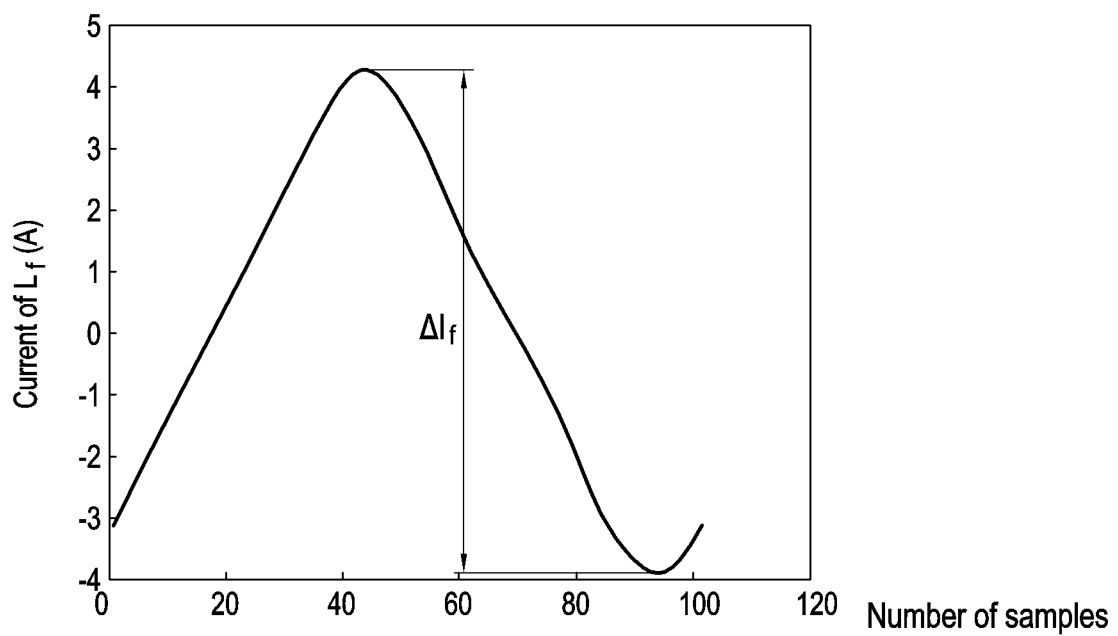

According to various embodiments, the current $I_f$ flowing through the RF choke inductor 3 ($L_f$) may be shown as the graph of FIG. 4B by taking 100 samples in the $T_s$ period. Referring to FIG. 4B, the magnitude $\Delta I_f$ of the ripple of $I_f$ may have a value of −4 amperes (A) to 4 A. $\Delta I_f$ may be expressed as in Equation 1 below.

$$\Delta I_f = \frac{DT_s}{L_f} \times V_{in} \quad \text{[Equation 1]}$$

Figure 4C:
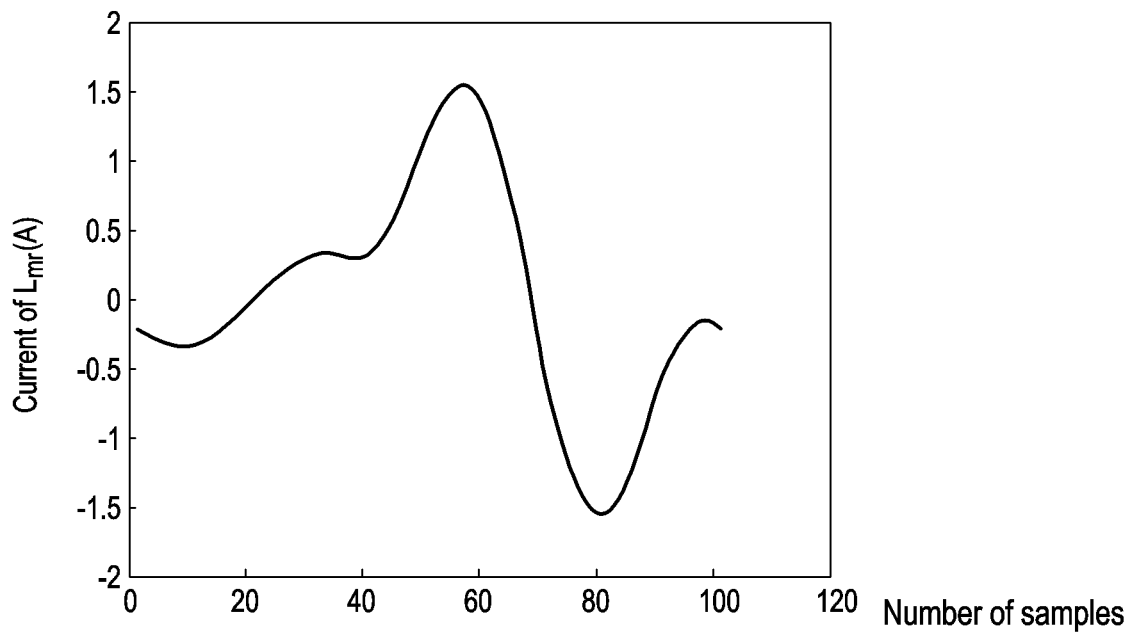

According to various embodiments, the current $I_{mr}$ flowing through the first LC resonance circuit 11 (e.g., the first inductor 11a and the first capacitor 11b) may be shown as the graph of FIG. 4C by taking 100 samples in the $T_s$ period. Referring to FIG. 4C, it may be identified that a second or higher harmonic frequency signal is included unlike in FIG. 4A.

Figure 4D:
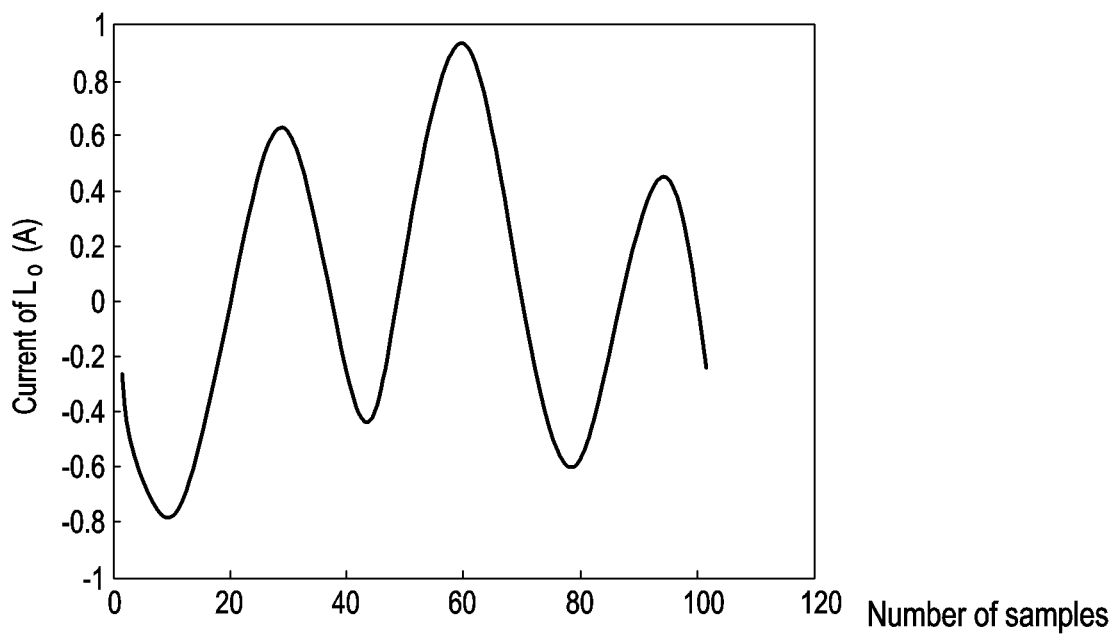

According to various embodiments, the current $I_s$ flowing through the second LC resonance circuit 13 (e.g., the second capacitor 13a and the second inductor 13b) may be shown as the graph of FIG. 4D by taking 100 samples in the $T_s$ period.

According to various embodiments, the matching circuit 15 may include a third capacitor 201 ($C_{ps}$) connected in series with the second LC resonance circuit 13 and a fourth capacitor 202 ($C_{po}$) connected in parallel with the second LC resonance circuit 13. According to various embodiments, a transmission coil may include a third inductor 203 ($L_{tx}$) and a first resistor 204 ($R_{tx}$) connected in series with the third capacitor 201. The third inductor 203 ($L_{tx}$) and the first resistor 204 ($R_{tx}$) may be modeled as an impedance $Z_{in}$ along with the load impedance 17 ($Z_L$) (See FIG. 8).

Figure 4E:
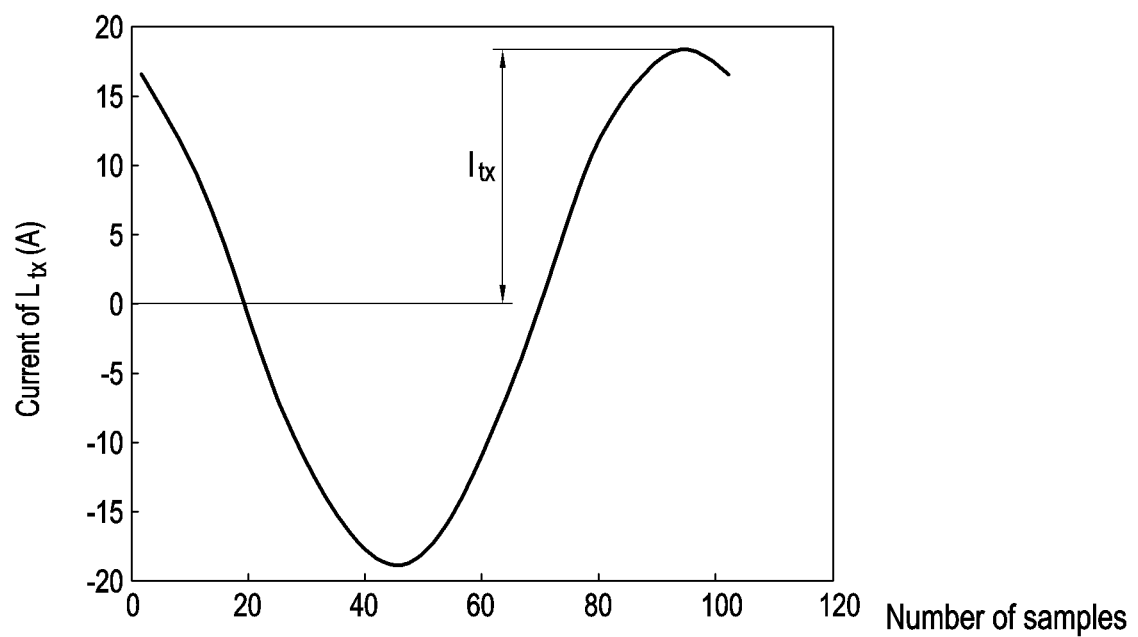

According to various embodiments, the current $I_{tx}$ flowing through the transmission coil (e.g., the current flowing through the third inductor 203 ($L_{tx}$) and the first resistor 204 ($R_{tx}$)) may be shown as the graph of FIG. 4E by taking 100 samples in the $T_s$ period. According to various embodiments, as the distance to the metal (e.g., wireless power receiving device) decreases, the coupling may increase. If the load impedance 17 ($Z_L$) is represented as $R_L + jX_L$, the real component $R_L$ of the load impedance 17 ($Z_L$) may increase so that the resistance $R_L$ of the load impedance 17 ($Z_L$) may increase. In contrast, the imaginary component XL of the load impedance 17 ($Z_L$) may reduce so that the reactance $X_L$ of the load impedance 17 ($Z_L$) may decrease.

In the following embodiments, a method for sensing the reactance $X_L$ of the load impedance 17 based on $V_{ds}$ shown in FIG. 4A is described.

Figure 5A:
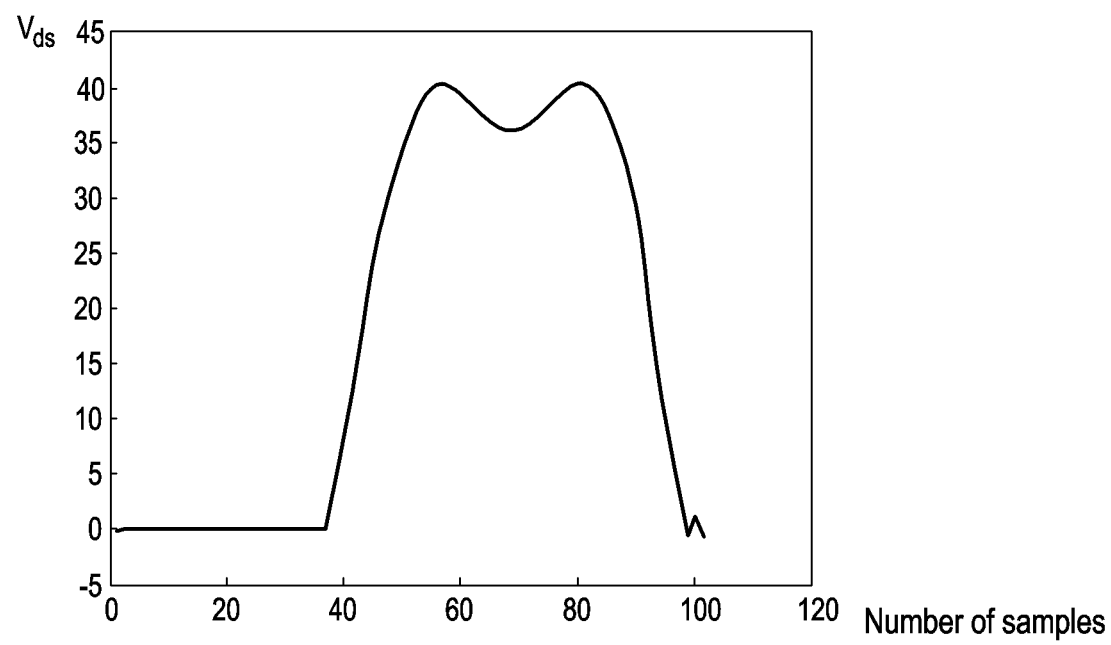
FIG. 5A is a graph illustrating a switching waveform of a transistor on a time axis according to various embodiments of the disclosure.
Figure 5B:
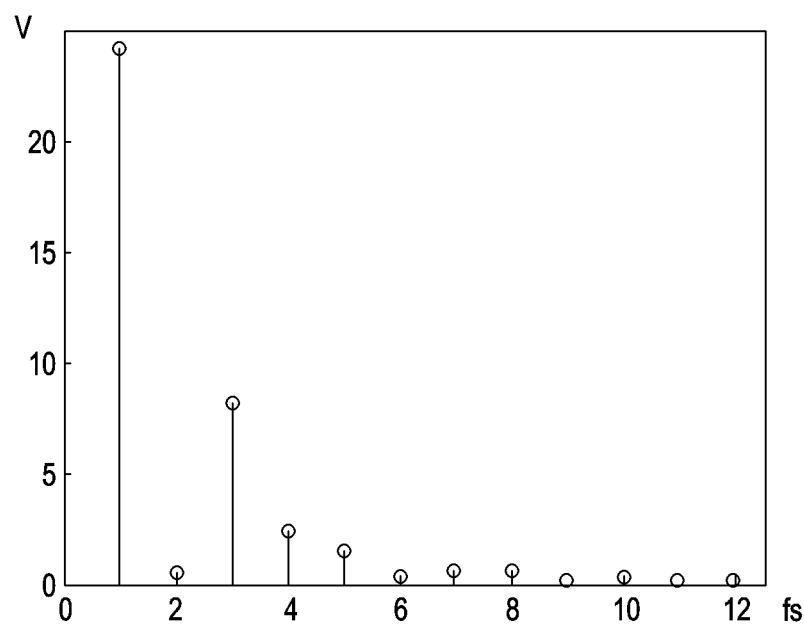
FIG. 5B is a graph illustrating a switching waveform of a transistor on a frequency axis according to various embodiments of the disclosure.
Figure 6A:
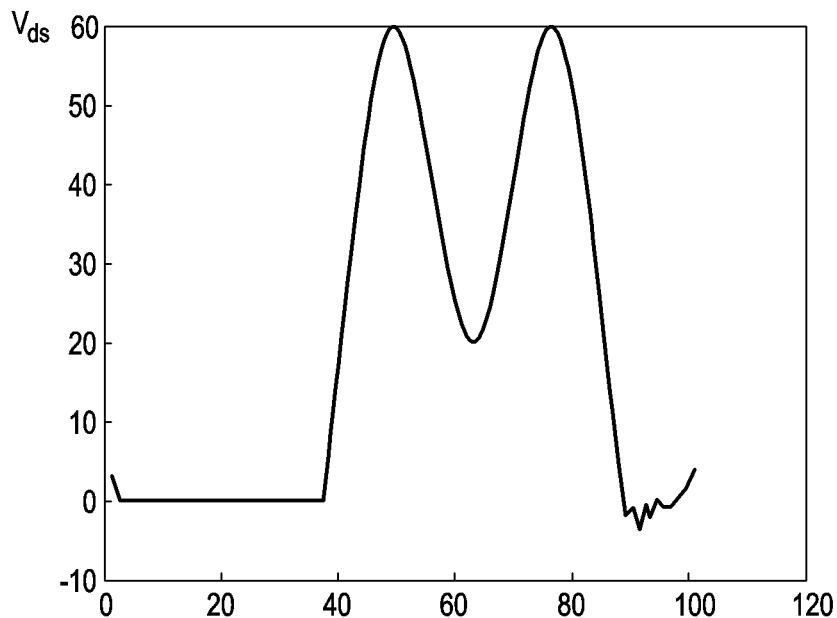
FIG. 6A is a graph illustrating a switching waveform of a transistor on a time axis according to various embodiments of the disclosure.
Figure 6B:
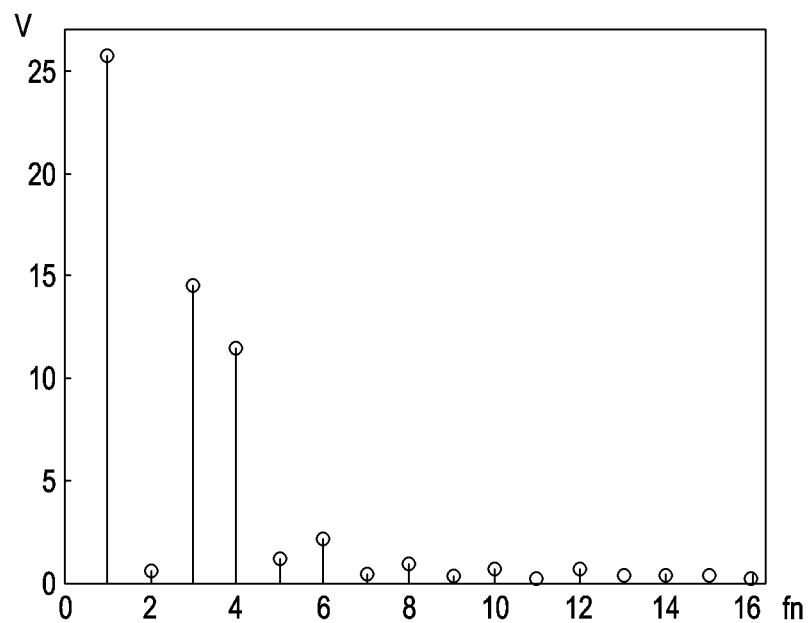
FIG. 6B is a graph illustrating a switching waveform of a transistor on a frequency axis according to various embodiments of the disclosure.

FIGS. 5A and 6A are graphs illustrating the switching waveform of a transistor on time axis according to various embodiments of the disclosure. FIGS. 5B and 6B are graphs illustrating the switching waveform of a transistor on frequency axis according to various embodiments of the disclosure. FIGS. 5A and 5B illustrate the $V_{ds}$ (the voltage applied between the drain and source of the transistor 7) waveform when the metal (e.g., wireless power receiving device) is a first distance away from the wireless power transmitting device, and FIGS. 6A and 6B illustrate the $V_{ds}$ waveform when the metal (e.g., wireless power receiving device) is away from the wireless power transmitting device by a second distance shorter than the first distance. Referring to FIGS. 5B and 6B, it may be identified that a significant difference in $V_{ds}$ occurs in the third harmonic. For example, when the third harmonic is sensed, the metal may approach, so that the reactance $X_L$ may increase. In this case, it may be identified that the third harmonic frequency signal $V_{ds,3rd}$ of $V_{ds}$ may increase from 8.07 V to 14.5 V as shown in FIGS. 6A and 6B. As such, it is possible to measure the reactance across the load by sensing the harmonic frequency signal of $V_{ds}$ (the voltage applied between the drain and source of the transistor 7).

Figure 7A:
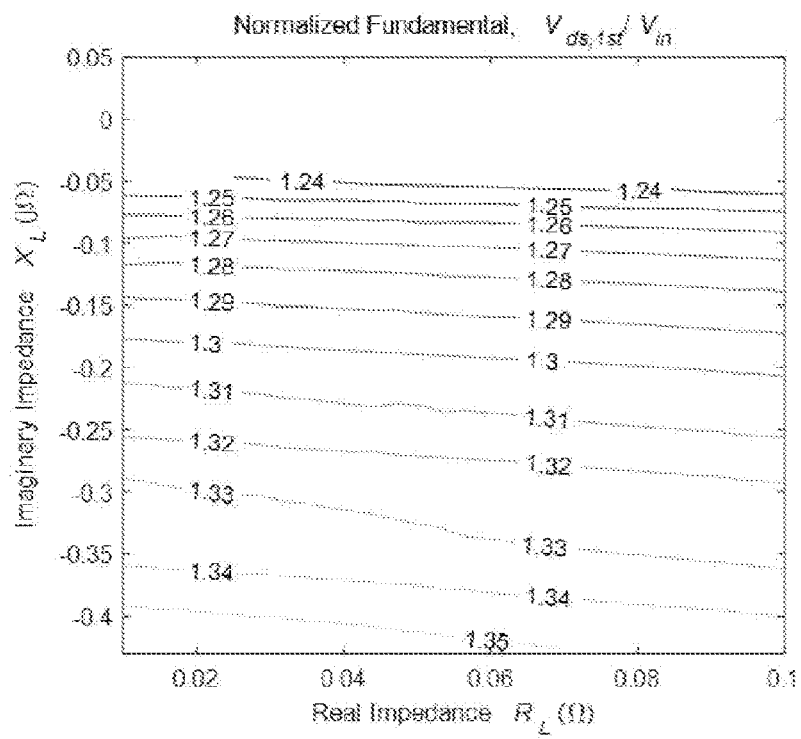
FIGS. 7A, 7B, and 7C are graphs illustrating the relationship between normalized sensing value and impedance according to various embodiments of the disclosure.
Figure 7B:
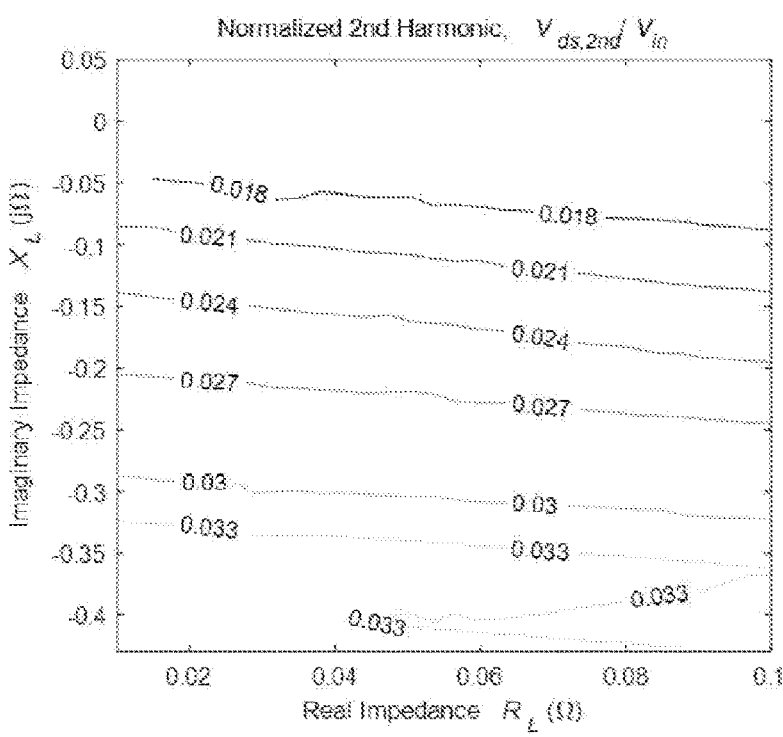
Figure 7C:
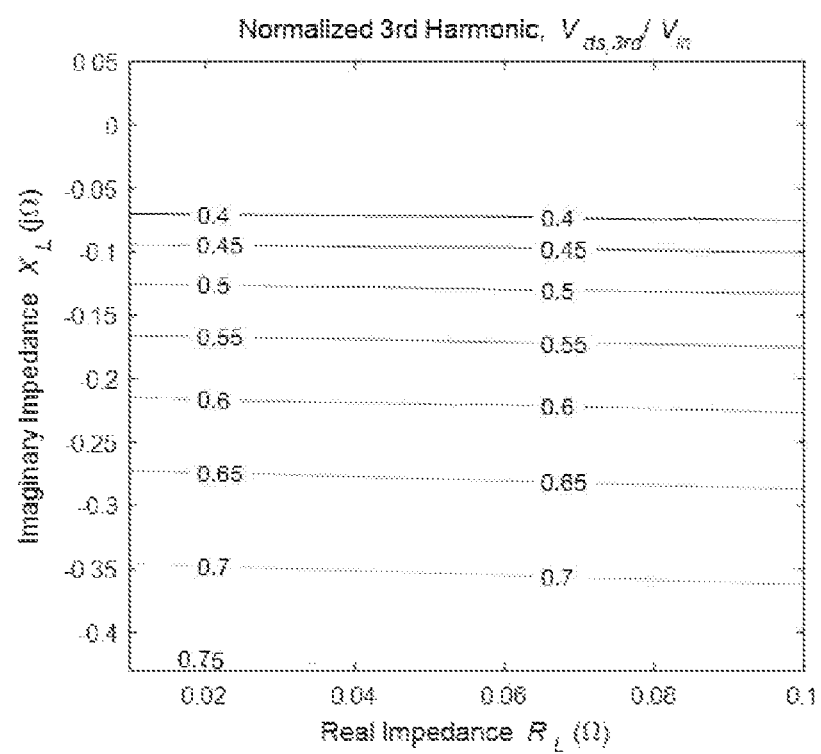

FIGS. 7A, 7B, and 7C are graphs illustrating the relationship between normalized sensing value and impedance according to various embodiments of the disclosure. Referring to FIG. 7A, it may be identified that if $V_{ds,1st}$, which is the first harmonic frequency (or fundamental or operating frequency) component of $V_{ds}$ (the voltage applied between the drain and source of the transistor 7) is normalized with the DC voltage $V_{in}$, it may become $V_{ds,1st}/V_{in}$, and $V_{ds,1st}/V_{in}$ obtained by normalizing $V_{ds,1st}$ with $V_{in}$ is less relevant to the resistance $R_L$ but is relevant to the reactance $X_L$. For example, when the reactance $X_L$ stepwise increases from −0.35 to −0.05 by 0.3, it may be identified that $V_{ds,1st}/V_{in}$ stepwise decreases from 1.34 to 1.24 by 0.1. According to various embodiments, the reactance XL or variations in $X_L$ may be estimated based on $V_{ds,1st}/V_{in}$ which is the result obtained by normalizing $V_{ds,1st}$ with $V_{in}$.

According to various embodiments, referring to FIG. 7B, it may be identified that if $V_{ds,2st}$ which is the second harmonic frequency component of $V_{ds}$ (the voltage applied between the drain and source of the transistor 7) is normalized with the DC voltage $V_{in}$, it may become $V_{ds,2st}/V_{in}$, and $V_{ds,2st}/V_{in}$ which is the result obtained by normalizing $V_{ds,2st}$ with $V_{in}$ is less relevant to the resistance $R_L$ but is relevant to the reactance $X_L$ like in FIG. 7A. For example, when the reactance $X_L$ stepwise increases from −0.3 to −0.05 by 0.25, it may be identified that $V_{ds,2st}/V_{in}$ stepwise decreases from 0.033 to 0.018 by 0.015. According to various embodiments, the reactance $X_L$ or variations in $X_L$ may be estimated based on $V_{ds,2st}/V_{in}$ which is the result obtained by normalizing $V_{ds,2st}$ with the DC voltage $V_{in}$.

According to various embodiments, referring to FIG. 7C, it may be identified that if $V_{ds,3st}$ which is the third harmonic frequency component of $V_{ds}$ (the voltage applied between the drain and source of the transistor 7) is normalized with the DC voltage $V_{in}$, it may become $V_{ds,3st}/V_{in}$, and $V_{ds,3st}/V_{in}$ which is the result obtained by normalizing $V_{ds,3st}$ with the DC voltage yin is less relevant to the resistance $R_L$ but is relevant to the reactance $X_L$ like in FIG. 7C. For example, when the reactance $X_L$ stepwise increases from −0.35 to −0.1 by 0.25, it may be identified that $V_{ds,3st}/V_{in}$ stepwise decreases from 0.7 to 0.4 by 0.3. According to various embodiments, the reactance $X_L$ or variations in $X_L$ may be estimated based on $V_{ds,3st}/V_{in}$ which is the result obtained by normalizing $V_{ds,3st}$ with the DC voltage $V_{in}$. As a comparative example, as compared between FIGS. 7A and 7C, the value obtained by normalizing the third harmonic frequency component of FIG. 7C is relatively larger in variation than the value obtained by normalizing the first harmonic frequency component of FIG. 7A, so that the sensing performance for the reactance $X_L$ may be better.

Figure 8:
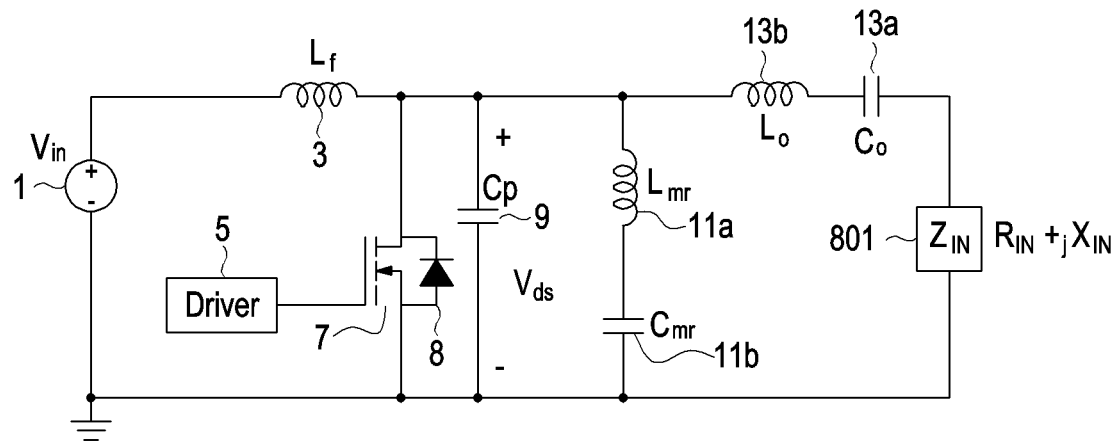
FIG. 8 is a circuit diagram illustrating a modeled wireless power transmitting device according to various embodiments of the disclosure.
Figure 9A:
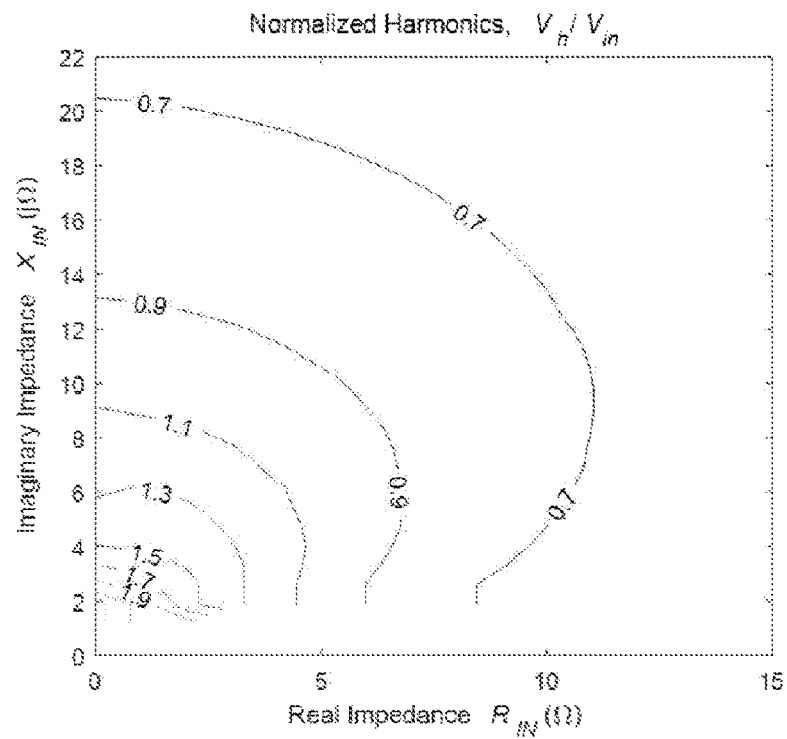
FIGS. 9A, 9B, and 9C are graphs illustrating the relationship between normalized sensing value and impedance according to various embodiments of the disclosure.
Figure 9B:
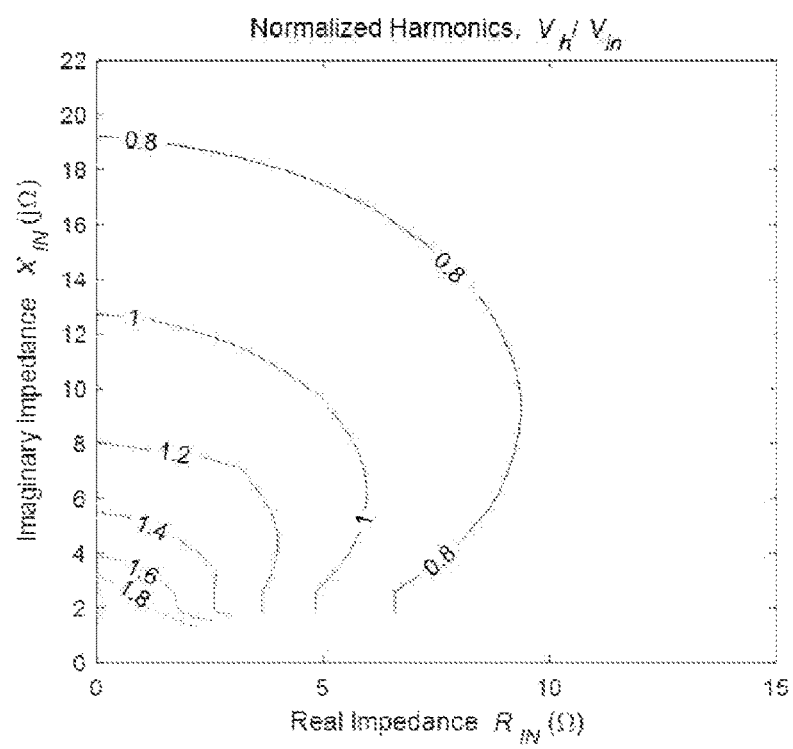
Figure 9C:
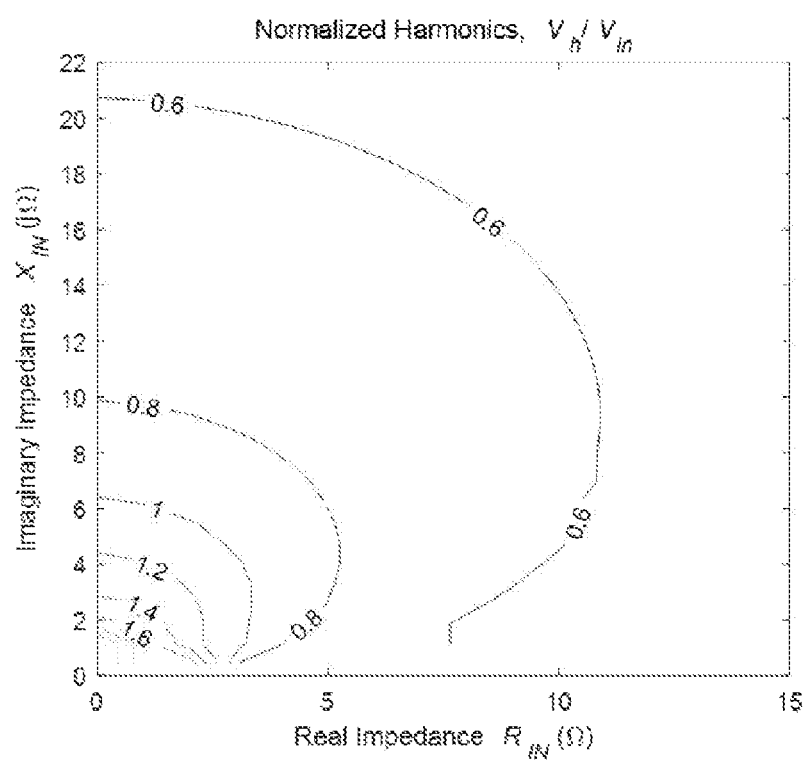

FIG. 8 is a circuit diagram illustrating a modeled wireless power transmitting device according to various embodiments of the disclosure. Referring to FIG. 8, as described above, $L_{tx}$, $R_{tx}$, and $Z_L$ may be modeled as the impedance 801 ($Z_{in}$) together. It may be identified through the modeled circuit as shown in FIG. 8 that the sum of the harmonic frequency components of $V_{ds}$ (the voltage applied between the drain and source of the transistor 7) is related to $X_{in}$ which is the reactance component of the impedance $Z_{in}$ as shown in FIGS. 9A, 9B, and 9C. Here, $R_{in}$ which is the resistance component of the impedance $Z_{in}$ may correspond to the first resistor 204 ($R_{tx}$).

For example, the sum of $V_{ds,3st}$ which is the third harmonic frequency component of $V_{ds}$, $V_{ds,4st}$ which is the fourth harmonic frequency component of Vas, $V_{ds}$, 5st which is the fifth harmonic frequency component of $V_{ds}$, and $V_{ds,6st}$ which is the sixth harmonic frequency component of $V_{ds}$ (the voltage applied between the drain and source of the transistor 7) may be represented as $V_h$. As compared with $X_{in}$, which is the value obtained by normalizing $V_h$ with the DC voltage $V_{in}$, it may be shown as shown in FIGS. 9A, 9B, and 9C. FIG. 9A shows the relationship between normalized $V_h$ and the reactance $X_L$ when Lf (the value of the RF choke inductor 3), Lo (the value of the second inductor 13b), and Lmr (the value of the first inductor 11a) are set to 200 nanohenries (nH), 66 nH, and 260 nH, respectively. FIG. 9B shows the relationship between normalized $V_h$ and the reactance $X_L$ when Lf, Lo, and Lmr are set to 300 nH, 300 nH, and 600 nH, respectively. FIG. 9C shows the relationship between normalized $V_h$ and the reactance $X_L$ when Lf, Lo, and Lmr are set to 350 nH, 116 nH, and 455 nH, respectively. It may be identified that in all of the three cases, normalized $V_h$ increases as $X_{in}$ decreases in a specific $R_{in}$ range (e.g., within 10 ohms (Ω)). Accordingly, the reactance $X_L$ or variations in $X_L$ may be estimated by normalized $V_h$ regardless of the inductance of each inductor.

Figure 10:
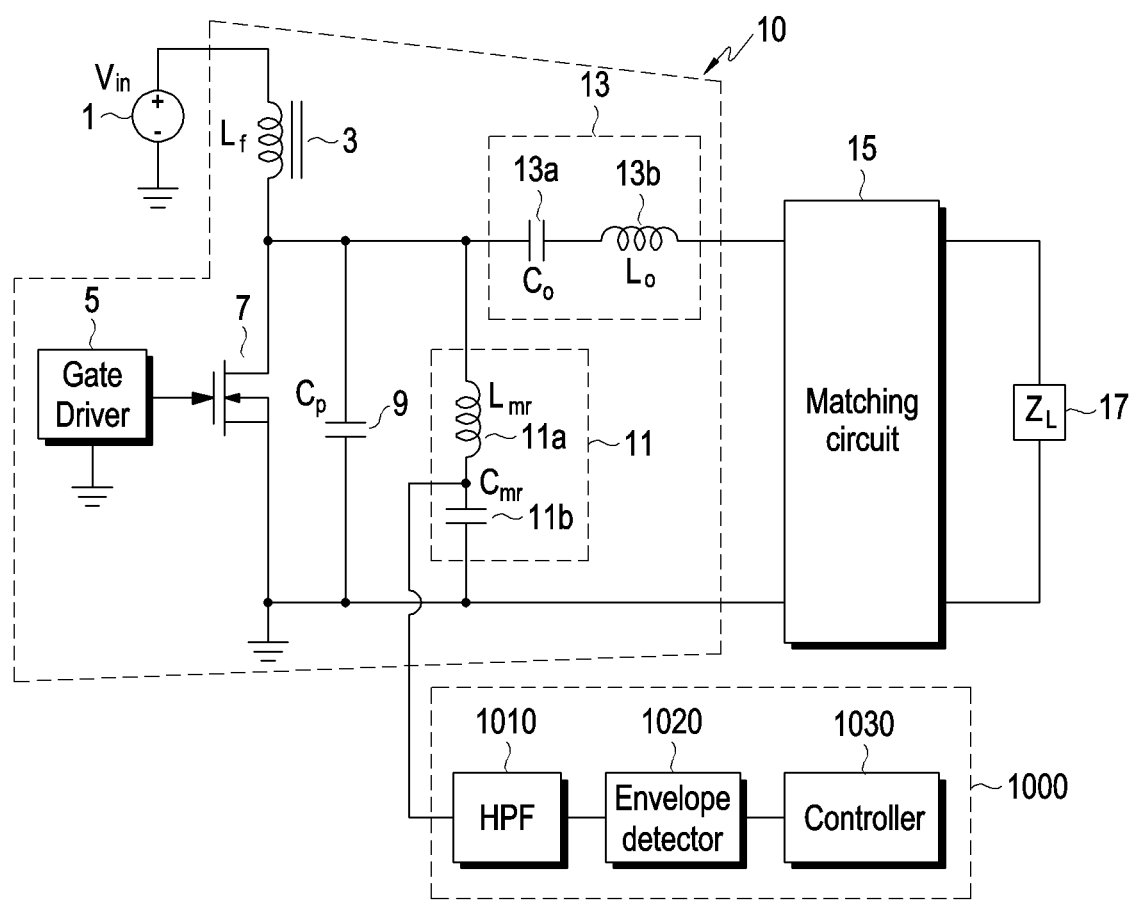
FIG. 10 is a circuit diagram illustrating a wireless power transmitting device according to various embodiments of the disclosure.

FIG. 10 is a circuit diagram illustrating a wireless power transmitting device according to various embodiments of the disclosure. Referring to FIG. 10, a wireless power transmitting device may include an inverter (e.g., the $EF_2$ inverter 10), a matching circuit 15, a resonator, and an impedance sensing circuit 1000. According to various embodiments, the $EF_2$ inverter 10 may include an RF choke inductor 3 (Lf), a gate driver 5, a transistor 7, a shunt capacitor 9 ($C_p$), a first LC resonance circuit 11, and a second LC resonance circuit 13. The impedance sensing circuit 1000 may include at least one of a high pass filter ("HPF") 1010, an envelope detector 1020, or a controller 1030.

The first LC resonance circuit 11 may be connected in parallel with the transistor 7. The first LC resonance circuit 11 may include a first inductor 11a (e.g., a coil) ($L_{mr}$) and a first capacitor 11b ($C_{mr}$) connected in series with each other. The first inductor 11a and the first capacitor 11b may have proper element values that allow the resonant frequency of the first LC resonance circuit 11 to correspond to the second harmonic frequency ($2f_s$) of the operating frequency ($f_s$) of the input signal. The first LC resonance circuit 11 may be electrically equivalent to a short circuit at the second harmonic frequency (as). The first LC resonance circuit 11 may be operated as a second harmonic filter (e.g., a band-stop filter) that prevents the second harmonic component of the RF power supplied by the transistor 7 from being transferred to the second LC resonance circuit 13 by being electrically shorted at the second harmonic frequency ($2f_s$). In FIG. 10, the same reference number as that of FIG. 1 may perform the same or similar function, and no detailed description thereof is given.

According to various embodiments, an HPF 1010 may be connected in parallel between the first inductor 11a and the first capacitor 11b. The HPF 1010 may include at least one capacitor (e.g., 1101 in FIG. 11) and at least one inductor (e.g., 1102 in FIG. 11). According to various embodiments, the voltage (hereinafter, '$V_{SAC}$') applied to the inductor included in the HPF 1010 may correspond to the voltage $V_{ds}$ applied between the drain and source of the transistor 7. Accordingly, the reactance $X_L$ or variations in $X_L$ may be estimated by sensing the voltage $V_{SAC}$ applied to the inductor (i.e., the voltage applied between two ends of the inductor) included in the HPF 1010. According to various embodiments, the output signal of the HPF 1010 may be provided to the envelope detector 1020. The envelope detector 1020 may detect the envelope of the signal filtered from the HPF 1010. For example, the output signal of the envelope detector 1020 may be the peak value of $V_{SAC}$. Hereinafter, the peak value of $V_{SAC}$ is denoted as $V_{SDC}$. Accordingly, the reactance $X_L$ or variations in $X_L$ may be estimated by sensing the voltage $V_{SAC}$ applied to the inductor included in the HPF 1010. The output value (e.g., $V_{SDC}$ which is the peak value of $V_{SAC}$) of the envelope detector 1020 may be input to the controller 1030. The controller 1030 may estimate the reactance $X_L$ or variations in $X_L$ based on the output value (e.g., $V_{SDC}$ which is the peak value of $V_{SAC}$) of the envelope detector 1020. For example, the controller 1030 may adjust the inductance or capacitance of the matching circuit 15 or the reactance $X_{in}$ of the impedance $Z_{in}$ including the load impedance 17 ($Z_L$) based on the output value (e.g., $V_{SDC}$ which is the peak value of $V_{SAC}$) of the envelope detector 1020. Various embodiments in which the controller 1030 adjusts the reactance $X_{in}$ of the impedance $Z_{in}$ including the load impedance 17 ($Z_L$) based on the output value (e.g., $V_{SDC}$ which is the peak value of $V_{SAC}$) of the envelope detector 1020 are described below with reference to FIGS. 14, 15, and 16.

Figure 11:
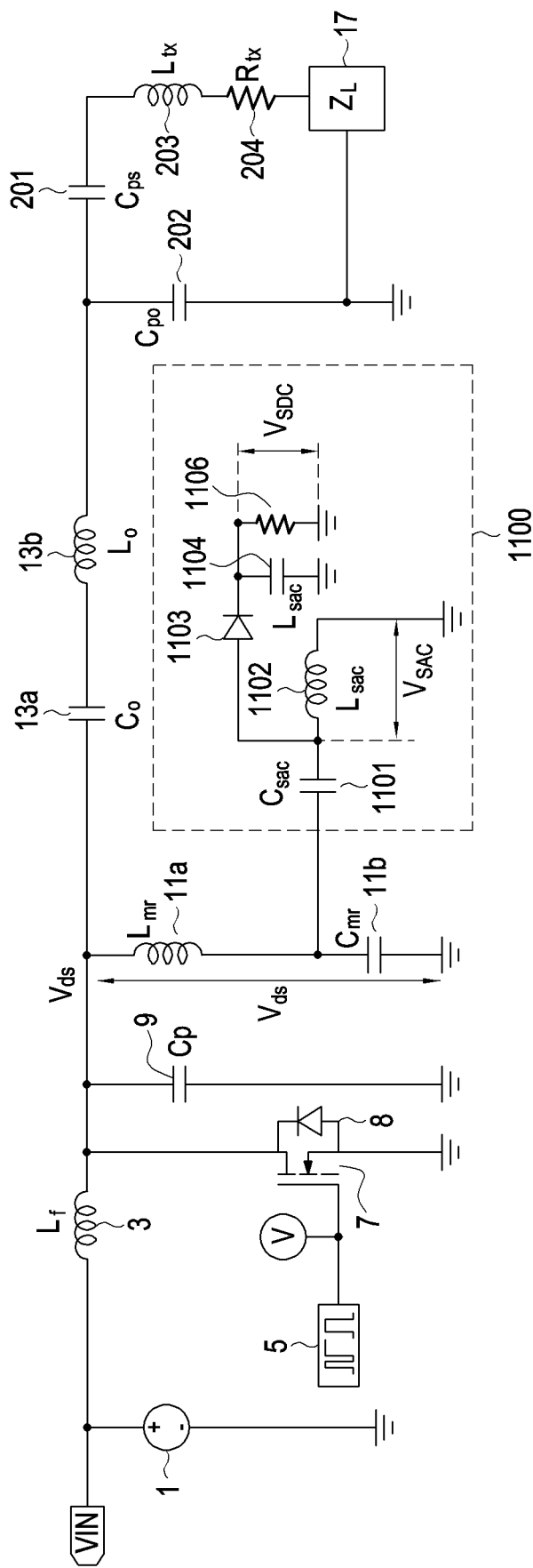
FIG. 11 is a circuit diagram illustrating a wireless power transmitting device according to various embodiments of the disclosure.

FIG. 11 is a circuit diagram illustrating a wireless power transmitting device according to various embodiments of the disclosure. In FIG. 11, certain reference numbers are omitted even though explanation thereof is provided in this specification. For such reference numbers, please refer to the corresponding part in FIG. 1 or FIG. 10. Referring to FIG. 11, a wireless power transmitting device may include an inverter (e.g., the $EF_2$ inverter 10), a matching circuit 15, a resonator, and an impedance sensing circuit 1100. According to various embodiments, the $EF_2$ inverter 10 may include an RF choke inductor 3 ($L_f$), a gate driver 5, a transistor 7, a shunt capacitor 9 ($C_p$), a first LC resonance circuit 11, and a second LC resonance circuit 13. The impedance sensing circuit 1100 may include at least one of an HPF or an envelope detector.

The first LC resonance circuit 11 may be connected in parallel with the transistor 7. The first LC resonance circuit 11 may include a first inductor 11a (e.g., a coil) ($L_{mr}$) and a first capacitor 11b ($C_{mr}$) connected in series with each other. The first inductor 11a and the first capacitor 11b may have proper element values that allow the resonant frequency of the first LC resonance circuit 11 to correspond to the second harmonic frequency ($2f_s$) of the operating frequency (L) of the input signal. The first LC resonance circuit 11 may be electrically equivalent to a short circuit at the second harmonic frequency ($2f_s$). The first LC resonance circuit 11 may be operated as a second harmonic filter (e.g., a band-stop filter) that prevents the second harmonic component of the RF power provided by the transistor 7 from being transferred to the second LC resonance circuit 13 by being electrically shorted at the second harmonic frequency ($2f_s$).

In FIG. 11, the same reference number as that of FIG. 1 may perform the same or similar function, and no detailed description thereof is given.

According to various embodiments, an HPF may be connected in parallel between the first inductor 11a and the first capacitor 11b. The HPF may include a fifth capacitor 1101 ($C_{sac}$) and a fourth inductor 1102 ($L_{sac}$). According to various embodiments, the voltage $V_{SAC}$ applied to the fourth inductor 1102 included in the HPF may correspond to the voltage $V_{ds}$ applied between the drain and source of the transistor 7. Accordingly, the reactance $X_L$ or variations in $X_L$ may be estimated by sensing the voltage $V_{SAC}$ applied to the fourth inductor included in the HPF 1010.

For example, the voltage $V_{SAC}$ applied to the fourth inductor 1102 may be calculated with the $V_{ds}$ voltage of each harmonic order and the gain of the sensor (e.g., the impedance sensing circuit 1000 or 1100) based on Equations 2 to 8 below. First, the gain Gn of each harmonic order may be represented as in Equation 2.

$$G_n = \frac{V_{SAC,n}}{V_{ds,n}} = \left| \frac{Z_{eq}}{Z_{lmr} + Z_{eq}} \frac{Z_{lac}}{Z_{lac} + Z_{cac}} \right| \quad \text{[Equation 2]}$$

In Equation 2, $Z_{eq}$, as the impedance of the first capacitor 11b11b ($C_{mr}$), the fifth capacitor 1101 1101 ($C_{sac}$), and the fourth inductor 1102 ($L_{sac}$), may be calculated as in Equation 3.

$$Z_{eq} = Z_{cmr} \| (Z_{lac} + Z_{cac}) \quad \text{[Equation 3]}$$

The impedance $Z_{cmr}$ of the first capacitor 11b ($C_{mr}$), the impedance $Z_{lmr}$ of the first inductor 11a ($L_{mr}$), the impedance $Z_{cac}$ of the fifth capacitor 1101 ($C_{sac}$), and the impedance $Z_{lac}$ of the fourth inductor 1102 ($L_{sac}$) may be represented as in Equation 4, Equation 5, Equation 6, and Equation 7, respectively.

$$Z_{cmr} = \frac{1}{jn\omega C_{mr}} \quad \text{[Equation 4]}$$

$$Z_{lmr} = jn\omega L_{mr} + R_{mr} \quad \text{[Equation 5]}$$

$$Z_{cac} = \frac{1}{jn\omega C_{sac}} \quad \text{[Equation 6]}$$

$$Z_{lac} = jn\omega L_{sac} + R_{sac} \quad \text{[Equation 7]}$$

By using the above equations, the voltage $V_{SAC}$ applied between both the ends of the fourth inductor 1102 may be calculated with the $V_{ds}$ voltage of each harmonic order and the gain of the sensor (e.g., the impedance sensing circuit 1000 or 1100). The value obtained by normalizing $V_{SAC}$ with the DC voltage Vu may be represented as in Equation 8.

$$\frac{V_{SAC}}{V_{in}} = \frac{G_1 V_{ds,1} + G_2 V_{ds,2} + G_3 V_{ds,3} + G_4 V_{ds,4} + \ldots + G_n V_{ds,n}}{V_{in}} \quad \text{[Equation 8]}$$

According to various embodiments, the envelope detector may be connected in parallel between the fifth capacitor 1101 ($C_{sac}$) and the fourth inductor 1102 ($L_{sac}$). For example, a second diode 1103 may be connected in parallel between the fifth capacitor 1101 ($C_{sac}$) and the fourth inductor 1102 ($L_{sac}$). A sixth capacitor 1104 and a second resistor 1106 may be connected to an end of the second diode 1103. The sixth capacitor 1104 and the second resistor 1106 may operate as an envelope detector (e.g., 1020 in FIG. 10) for detecting the peak of the input signal. According to various embodiments, the voltage applied to the sixth capacitor 1104 or the second resistor 1106 may be a value obtained by envelope-detecting the voltage of the fourth inductor 1102 and may correspond to $V_{SDC}$ which is the peak value of $V_{SAC}$.

According to various embodiments, the impedance sensing circuit 1100 may estimate the reactance $X_L$ or variations in $X_L$ by sensing $V_{SDC}$.

Figure 12:
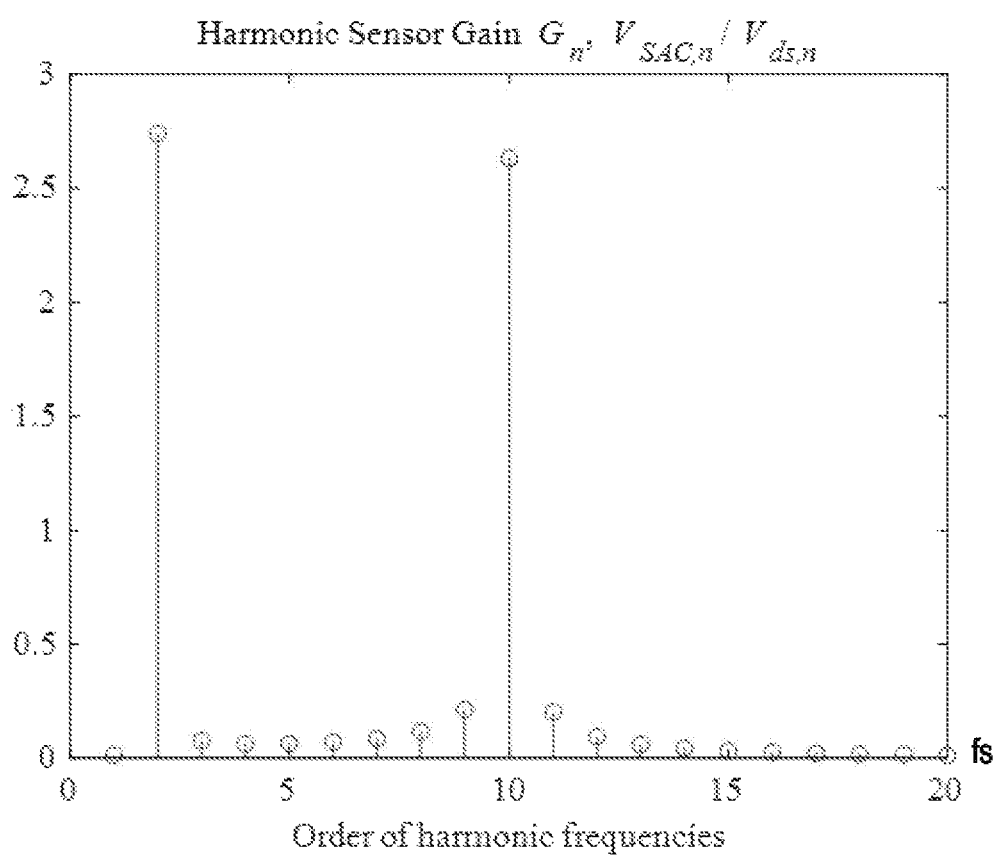
FIG. 12 is a graph illustrating a sensor gain per harmonic frequency according to various embodiments of the disclosure.

FIG. 12 is a graph illustrating a sensor gain per harmonic frequency according to various embodiments of the disclosure. FIG. 12 exemplifies that the gain G2 of the second harmonic frequency and the gain G10 of the tenth harmonic frequency are relatively high. Therefore, in Equation 8, $V_{SAC}$ may effectively sense the reactance $X_L$ by the second harmonic frequency component and the tenth harmonic frequency component.

Figure 13A:
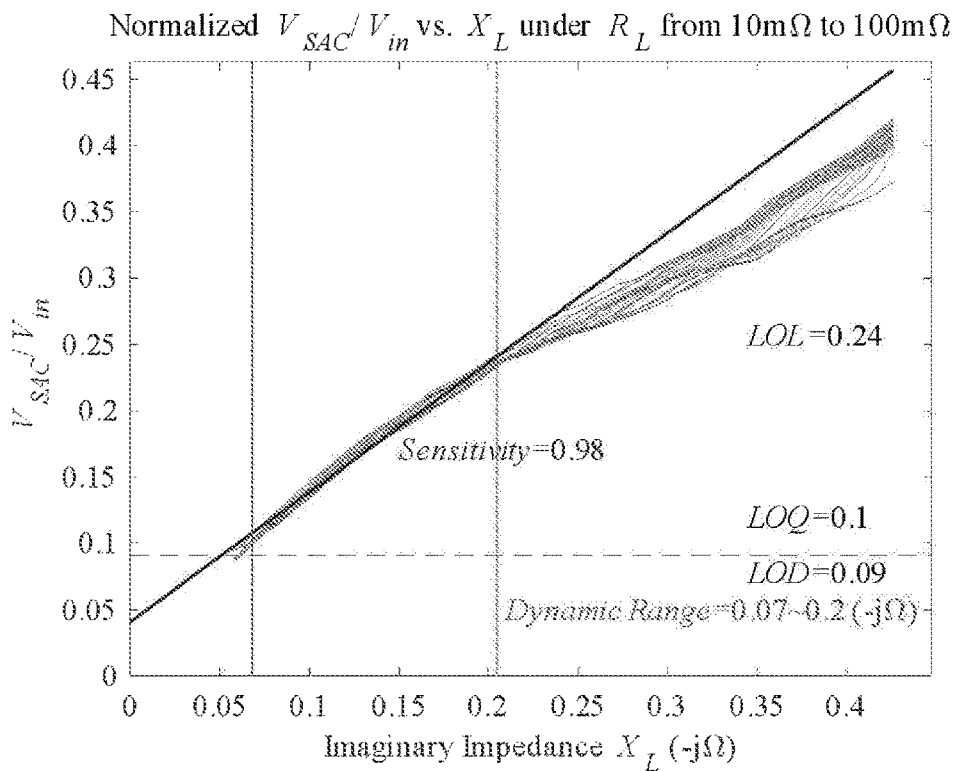
FIGS. 13A, 13B, and 13C are graphs illustrating the relationship between normalized sensing value and impedance according to various embodiments of the disclosure.
Figure 13B:
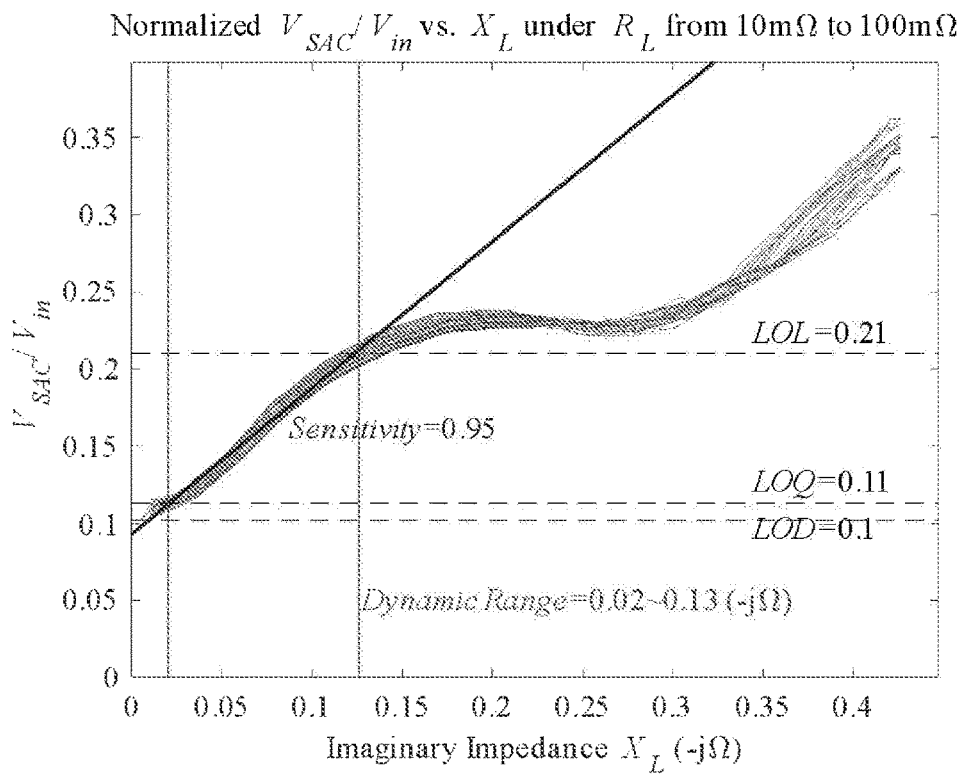
Figure 13C:
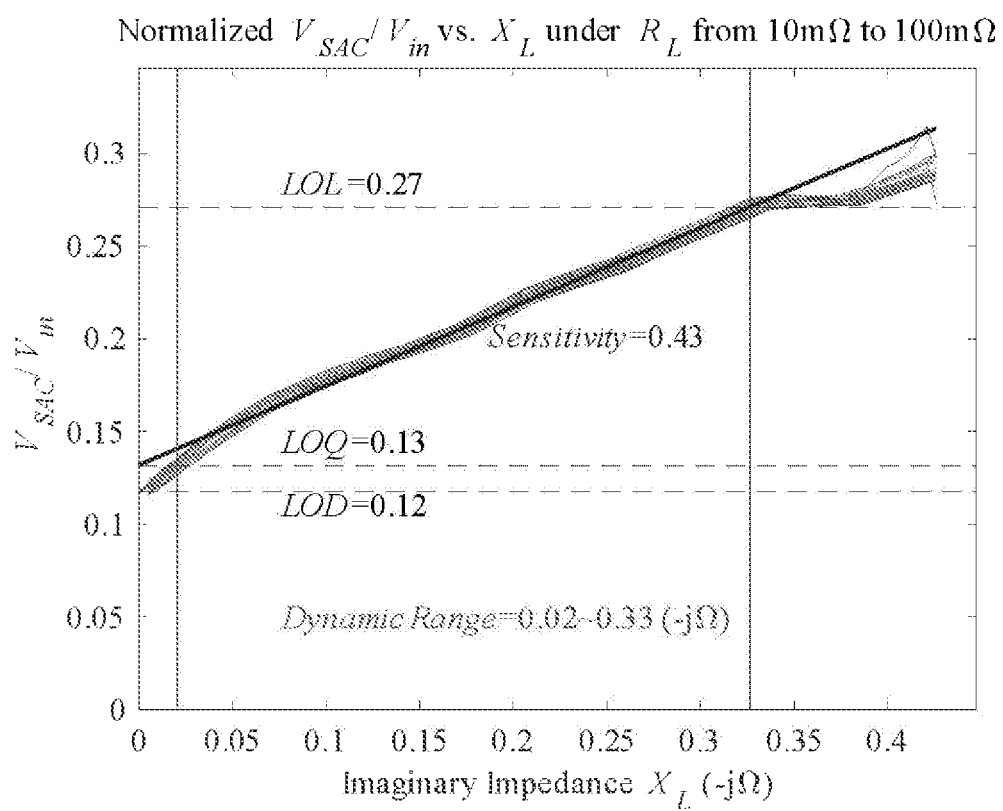

FIGS. 13A, 13B, and 13C are graphs illustrating the relationship between normalized sensing value and impedance according to various embodiments of the disclosure. FIGS. 13A, 13B, and 13C are graphs illustrating the correlation between the reactance $X_L$ and $V_{SAC}/V_{in}$ which is the result obtained by normalizing $V_{SAC}$ with the DC voltage $V_{in}$ for 30 values between 10 milliohms (mΩ) and 100 mΩ. FIG. 13A illustrates an experiment example when the network output inductor $L_{1p}$ is 20 nH, the value of the fifth capacitor 1101 ($C_{sac}$) is 1.8 picofarads (pF), and $L_{sac}$ is 2.2 microhenries (pH). FIG. 13B illustrates an experiment example when the network output inductor $L_{1p}$ is 30 nH, the value of the fifth capacitor 1101 ($C_{sac}$) is 2.1 pF, and $L_{sac}$ is 2.2 μH. FIG. 13C illustrates an experiment example when the network output inductor $L_{1p}$ is 40 nH, the value of the fifth capacitor 1101 ($C_{sac}$) is 2.7 pF, and $L_{sac}$ is 2.2 μH.

Referring to FIGS. 13A, 13B, and 13C, it may be identified that there occurs a correlation between the reactance $X_L$ and $V_{SAC}/V_{in}$ which is the result obtained by normalizing $V_{SAC}$ with the DC voltage $V_{in}$ regardless of the resistance $R_L$, sensor gain, and network output. For example, referring to FIG. 13A, it may be identified that a dynamic range is shown in the reactance $X_L$ range of 0.07 to 0.2, and the sensitivity is 0.98. Referring to FIG. 13B, it may be identified that a dynamic range is shown in the reactance $X_L$ range of 0.02 to 0.13, and the sensitivity is 0.95. Referring to FIG. 13A, it may be identified that a dynamic range is shown in the reactance $X_L$ range of 0.02 to 0.33, and the sensitivity is 0.43. Referring to FIGS. 13A, 13B, and 13C, it may be identified that the gain increases as the value of the fifth capacitor 1101 ($C_{sa}c$) increases, so that the sensitivity increases.

Figure 14:
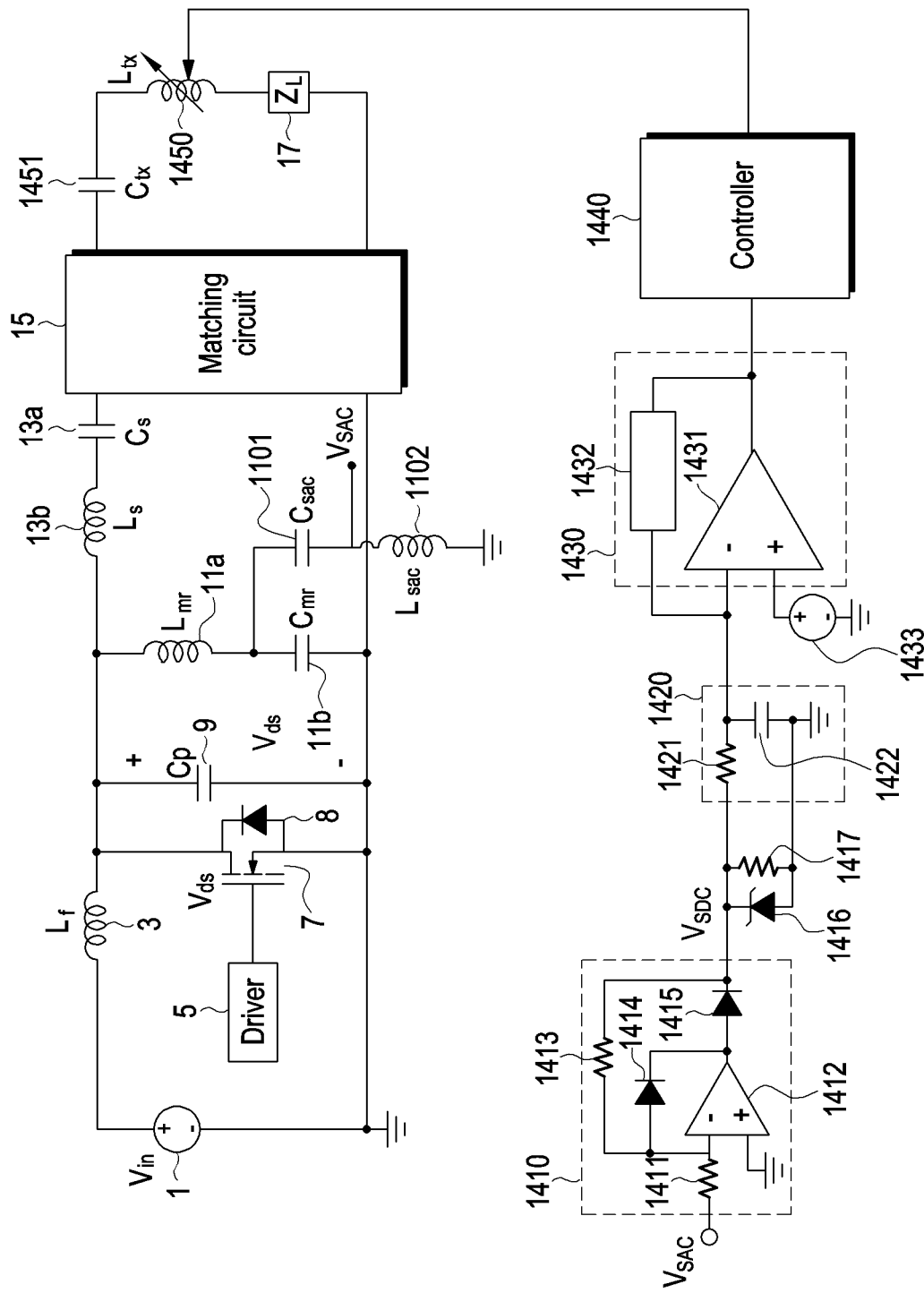
FIG. 14 is a circuit diagram illustrating a wireless power transmitting device according to various embodiments of the disclosure.

FIG. 14 is a circuit diagram illustrating a wireless power transmitting device according to various embodiments of the disclosure. In FIG. 14, certain reference numbers are omitted even though explanation thereof is provided in this specification. For such reference numbers, please refer to the corresponding part in FIG. 1 or FIG. 10. Referring to FIG. 14, a wireless power transmitting device may include an inverter (e.g., the EF₂ inverter 10), a matching circuit 15, a resonator, and an impedance sensing circuit. According to various embodiments, the EF₂ inverter 10 may include an RF choke inductor 3 ($L_f$), a gate driver 5, a transistor 7, a shunt capacitor 9 ($C_p$), a first LC resonance circuit 11, and a second LC resonance circuit 13. The resonator may include a seventh capacitor 1451 ($C_{tx}$) and a variable coil 1450 ($L_{tx}$) (i.e., the transmission coil). The impedance sensing circuit may include an HPF including a fifth capacitor 1101 and a fourth inductor 1102, an envelope detector 1410, a low pass filter ("LPF") 1420, an error detector 1430, and a controller 1440. In FIG. 14, the same reference number as that of FIG. 11 may perform the same or similar function, and no detailed description thereof is given.

According to various embodiments, an HPF may be connected in parallel between the first inductor 11a and the first capacitor 11b. The HPF may include a fifth capacitor 1101 ($C_{sac}$) and a fourth inductor 1102 ($L_{sac}$). According to various embodiments, the voltage $V_{SAC}$ applied to the fourth inductor 1102 included in the HPF may correspond to the voltage $V_{ds}$ applied between the drain and source of the transistor 7. Accordingly, the reactance $X_L$ or variations in $X_L$ may be estimated by sensing the voltage $V_{SAC}$ applied to the fourth inductor 1102 included in the HPF 1010. The voltage $V_{SAC}$ applied to the fourth inductor 1102 may be applied to the envelope detector 1410. The envelope detector 1410 may include a third resistor 1411, a first comparator 1412, a fourth resistor 1413, a third diode 1414, and a fourth diode 1415. The output of the envelope detector 1410 may be $V_{SDC}$ which is the peak value of the input voltage $V_{SAC}$. A fifth diode 1416 and a fifth resistor 1417 may be connected in parallel to the output terminal of the envelope detector 1410. An LPF 1420 may be connected to the output terminal of the envelope detector 1410. The LPF 1420 may include a fifth resistor 1421 and an eighth capacitor 1422. The LPF 1420 may be connected with the error detector 1430. The error detector 1430 may include a second comparator 1431 and a feedback circuit 1432. The second comparator 1431 may receive $V_{SDC}$ through the first input terminal (e.g., the minus terminal) and a reference voltage $V_{ref}$ through the second input terminal (e.g., the plus terminal) supplied from a voltage source 1433 and compare the two input values. For example, the second comparator 1431 may output the difference between $V_{SDC}$ and the reference voltage $V_{ref}$ to the controller 1440. According to various embodiments, the controller 1440 may adjust the inductance of the variable coil 1450 ($L_{tx}$) of the resonator based on the difference between $V_{SDC}$ and the reference voltage $V_{ref}$. For example, as a method for adjusting the inductance of the variable coil 1450 ($L_{tx}$), the inductance may be adjusted by bringing a ferrite core closer to the coil, using a servo motor, a micro-step motor, or a piezo actuator. As another example, the inductance may be adjusted by increasing the number of turns of the coil by switching-controlling the auxiliary coil magnetically coupled with the coil of the resonator.

Figure 15:
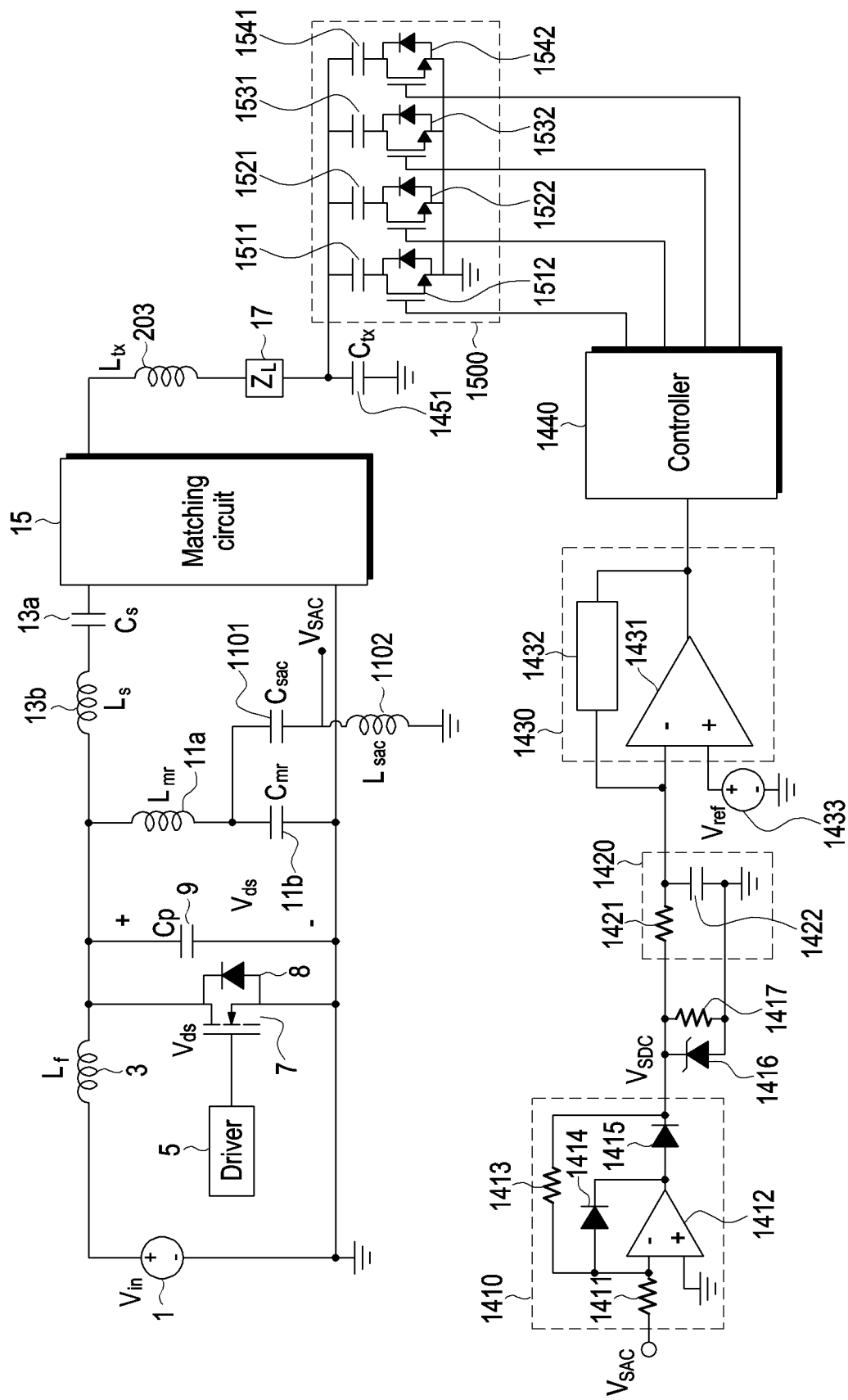
FIG. 15 is a circuit diagram illustrating a wireless power transmitting device according to various embodiments of the disclosure.

FIG. 15 is a circuit diagram illustrating a wireless power transmitting device according to various embodiments of the disclosure. In FIG. 15, certain reference numbers are omitted even though explanation thereof is provided in this specification. For such reference numbers, please refer to the corresponding part in FIG. 1 or FIG. 10. Referring to FIG. 15, a wireless power transmitting device may include an inverter (e.g., the $EF_2$ inverter 10), a matching circuit 15, a resonator, and an impedance sensing circuit. According to various embodiments, the $EF_2$ inverter 10 may include an RF choke inductor 3 ($L_f$), a gate driver 5, a transistor 7, a shunt capacitor 9 ($C_p$), a first LC resonance circuit 11, and a second LC resonance circuit 13. The resonator may include a third coil 203 ($L_{tx}$) and a seventh capacitor 1451 ($C_{tx}$). According to various embodiments, a capacitance adjusting circuit 1500 may be connected in parallel between the third coil 203 and the seventh capacitor 1451. At least one capacitors 1511, 1521, 1531, and 1541 may be connected in parallel in the capacitance adjusting circuit 1500, and switches (e.g., MOSFET) 1512, 1522, 1532, and 1542 may be connected in series to capacitors 1511, 1521, 1531, and 1541, respectively. The impedance sensing circuit may include an HPF including a fifth capacitor 1101 and a fourth inductor 1102, an envelope detector 1410, a low pass filter (LPF) 1420, an error detector 1430, and a controller 1440. In FIG. 15, the same reference number as those of FIGS. 11 and 14 may perform the same or similar function, and no detailed description thereof is given.

As described above in connection with FIG. 14, the second comparator 1431 may output the difference between $V_{SDC}$ and the reference voltage $V_{ref}$ to the controller 1440. According to various embodiments, as shown in FIG. 15, the controller 1440 may control at least one switch (e.g., MOSFET) 1512, 1522, 1532, and 1542, included in the capacitance adjusting circuit 1500, to turn on or off, based on the difference between $V_{SDC}$ and the reference value $V_{ref}$, thereby adjusting the total capacitance connected to the load 17. For example, the controller 1440 may control at least one switch (e.g., MOSFET) 1512, 1522, 1532, and 1542, included in the capacitance adjusting circuit 1500, to turn on based on the difference between $V_{SDC}$ and the reference value $V_{ref}$, thereby increasing the total capacitance by the capacitor connected in parallel with 1451 ($C_{tx}$). For example, the seventh capacitor 1451 with at least one capacitor 1511, 1521, 1531, and 1541 connected with the at least one turned-on switch 1512, 1522, 1532, and 1542 may correspond to a "variable capacitor" of which capacitance may be adjustable by the controller 1440 based on the difference between $V_{SDC}$ and the reference voltage $V_{ref}$.

Figure 16:
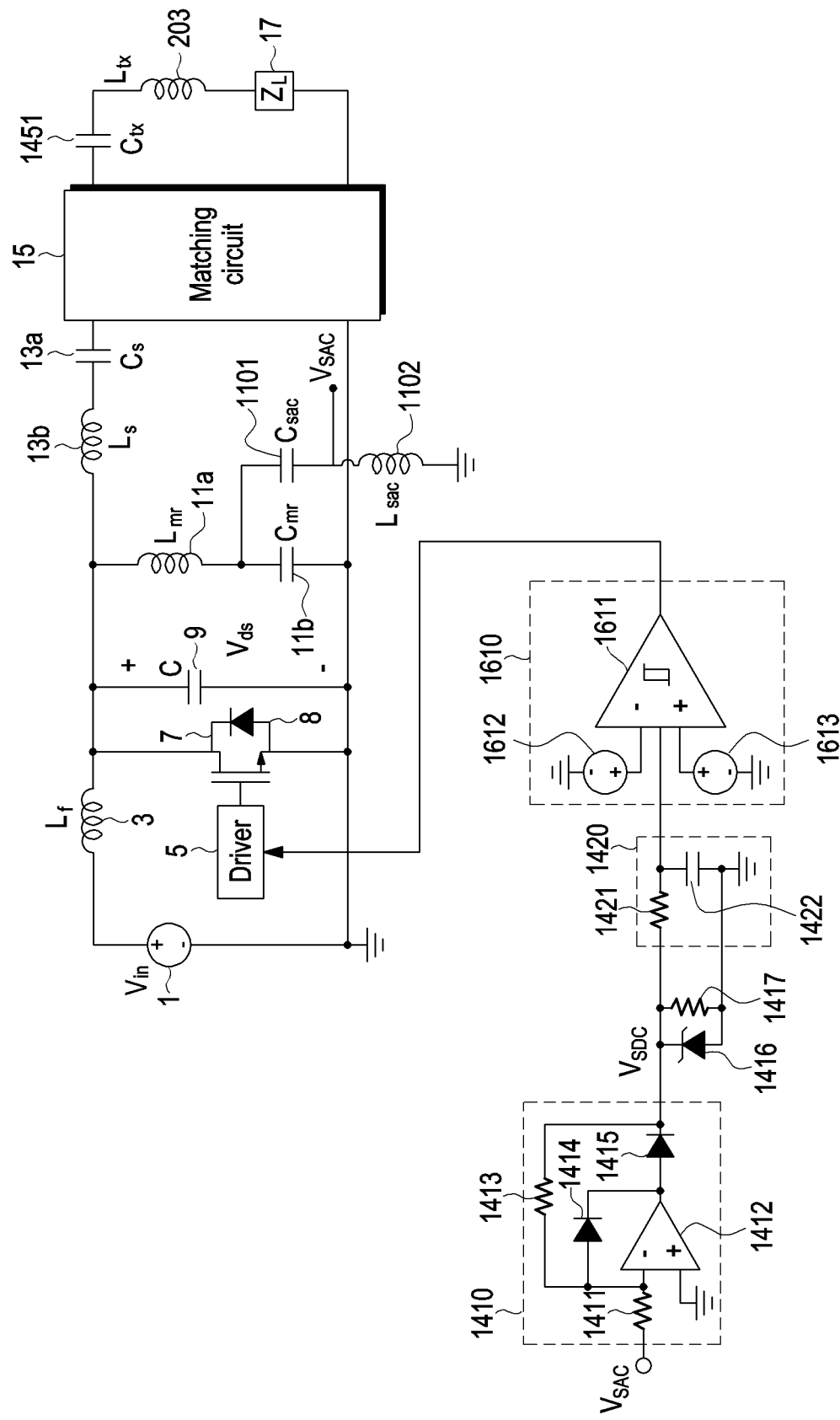
FIG. 16 is a circuit diagram illustrating a wireless power transmitting device according to various embodiments of the disclosure.

FIG. 16 is a circuit diagram illustrating a wireless power transmitting device according to various embodiments of the disclosure. In FIG. 16, certain reference numbers are omitted even though explanation thereof is provided in this specification. For such reference numbers, please refer to the corresponding part in FIG. 1 or FIG. 10. Referring to FIG. 16, a fifth diode 1416 and a fifth resistor 1417 may be connected in parallel to the output terminal of the envelope detector 1410. An LPF 1420 may be connected to the output terminal of the envelope detector 1410. The LPF 1420 may include a fifth resistor 1421 and an eighth capacitor 1422. The LPF 1420 may be connected with a comparator 1610 (e.g., a hysteresis comparator). The comparator 1610 may compare the input $V_{SDC}$ with an upper threshold $V_{high}$ supplied from a voltage source 1613 and lower threshold $V_{low}$ supplied from a voltage source 1612 and, when $V_{SDC}$ is higher than the upper threshold $V_{high}$ or lower than the lower threshold $V_{low}$, determine an abnormal state (e.g., over voltage protection ("OVP"), over-power, or excess of allowable impedance). When the comparator 1610 determines the abnormal state, a control signal (e.g., a disable signal) may be transmitted to the gate driver 5. The gate driver 5 may control the output of the wireless power transmitting device based on the control signal received from the comparator 1610. For example, the gate driver 5 may control the transistor 7 to turn on or off based on the control signal received from the comparator 1610.

Figure 17:
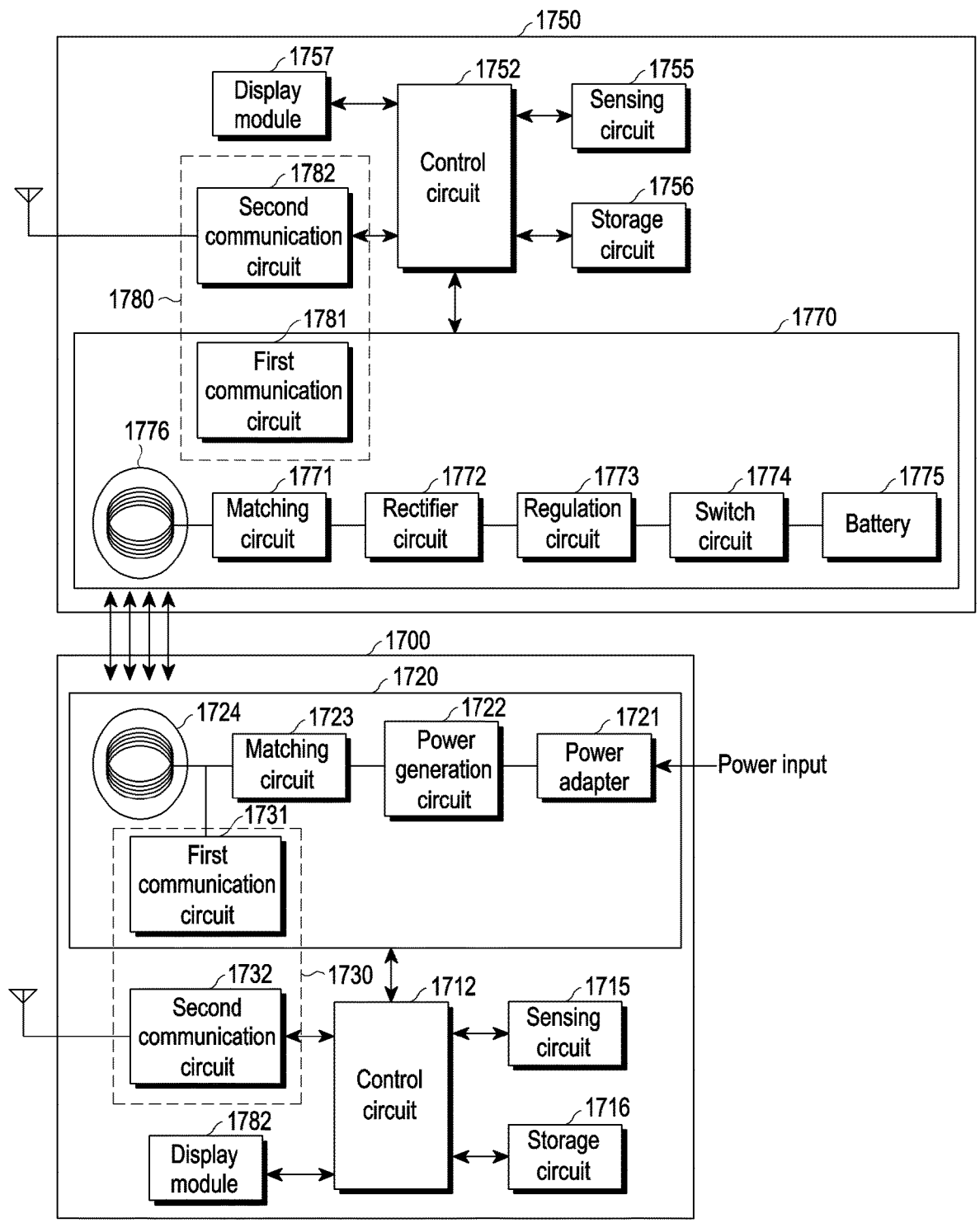
FIG. 17 is a circuit diagram illustrating a wireless power transmitting device and a wireless power receiving device according to various embodiments.

FIG. 17 is a block diagram illustrating a power transmitting unit 1700 and a power receiving unit 1750 according to various embodiments.

According to various embodiments, a power transmitting unit 1700 (e.g., a wireless power transmitting device) may include a power transmission circuit 1720, a control circuit 1712, a communication circuit 1730, a sensing circuit 1715, and/or a storage circuit 1716.

According to various embodiments, the power transmitting unit 1700 may provide power to the power receiving unit 1750 through the power transmission circuit 1720. For example, the power transmitting unit 1700 may transmit power according to the resonance scheme. In the case of the resonance scheme, the power transmitting unit 1700 may be implemented, e.g., in a scheme defined in the alliance for wireless power (A4WP) standards (or air fuel alliance (AFA) standards). The power transmitting unit 1700 may include a conductive pattern 1724 (e.g., transmission coil) that may generate an induced magnetic field (e.g., Tx field) when current (e.g., AC current) flows therethrough, according to the resonance scheme or induction scheme. A process in which the power transmitting unit 1700 generates a magnetic field (e.g., Tx field) through the conductive pattern 1724 may be represented as outputting wireless power, and a process of generating an induced electromotive force at the power receiving unit 1750 based on the magnetic field (e.g., Tx field) generated through the conductive pattern 1724 may be represented as receiving wireless power. It may be expressed that the power transmitting unit 1700 wirelessly transmits the power to the power receiving unit 1750 through such process. Further, the power receiving unit 1750 may include a conductive pattern 1776 (e.g., receiving coil) where an induced electromotive force is generated by the magnetic field (e.g., Tx field) whose magnitude is varied over time, formed around. As an induced electromotive force is generated at the conductive pattern 1776 of the power receiving unit 1750, A process in which an AC current is output from the conductive pattern 1776 or an AC voltage is applied to the conductive pattern 1776 may be represented as a process for wirelessly receiving power by the power receiving unit 1750. As another example, the power transmitting unit 1700 may transmit power according to the induction scheme. In the case of the induction scheme, the power transmitting unit 1700 may be implemented in a scheme defined in the wireless power consortium (WPC) standards (or Qi standards).

According to various embodiments, the power transmission circuit 1720 may include a power adapter 1721, a power generation circuit 1722, a matching circuit 1723, a conductive pattern (e.g., transmission coil) 1724, or a first communication circuit 1731. According to various embodiments, the power transmission circuit 1720 may be configured to wirelessly transmit power to the power receiving unit 1750 through the conductive pattern 1724. According to various embodiments, the power transmission circuit 1720 may receive power in the form of a DC or AC waveform from the outside and may supply the received power, in the form of an AC waveform, to the power receiving unit 1750.

According to various embodiments, the power adapter 1721 may receive AC or DC power from the outside or receive a power signal of a battery device to output DC power having a set voltage value. According to various embodiments, the voltage value of DC power output from the power adapter 1721 may be controlled by the control circuit 1712. According to various embodiments, the DC power output from the power adapter 1721 may be output to the power generation circuit 1722.

According to various embodiments, the power generation circuit 1722 may convert a DC current output from the power adapter 1721 into an AC current and output the converted current. According to various embodiments, the power generation circuit 1722 may include a predetermined amplifier (not shown). According to various embodiments, if the DC current input through the power adapter 1721 is smaller than a set gain, the power generation circuit 1722 may amplify the DC current to have the set gain using the amplifier (not shown). Alternatively, the power generation circuit 1722 may include a circuit that converts the DC current input from the power adapter 1721 into AC current based on a control signal input from the control circuit 1712.

For example, the power generation circuit 1722 may convert the DC current input from the power adapter 1721 into AC current through a predetermined inverter (not shown). Alternatively, the power generation circuit 1722 may include a gate driving device (not shown). The gate driving device (not shown) may control the on/off of the DC current input from the power adapter 1721 to convert the DC current into AC current. Alternatively, the power generation circuit 1722 may generate an AC power signal through a wireless power generator (e.g., an oscillator).

According to various embodiments, a matching circuit 1723 may perform impedance matching. For example, if the AC current (e.g., AC signal) output from the power generation circuit 1722 is transferred to the conductive pattern 1724, an electromagnetic field may be formed at the conductive pattern 1724 based on the transferred AC signal. The frequency band of the formed electromagnetic field (e.g., electromagnetic signal) may be adjusted by adjusting the impedance of the matching circuit 1723. According to various embodiments, the matching circuit 1723 may perform control so that the output power transmitted from the conductive pattern 1724 to the power receiving unit 1750 has high efficiency or high output by impedance adjustment. According to various embodiments, the matching circuit 1723 may adjust impedance based on the control of the control circuit 1712. The matching circuit 1723 may include at least one of an inductor (e.g., coil), a capacitor, or a switching device. The control circuit 1712 may control the state of connection with at least one of the inductor or capacitor through the switching device, thereby performing impedance matching.

According to various embodiments, the first communication circuit 1731 (e.g., a resonance circuit) may perform communication (e.g., data communication), in an in-band type, using the electromagnetic wave generated by the conductive pattern 1724.

According to various embodiments, the sensing circuit 1715 may sense variations in current/voltage applied to the conductive pattern 1724 of the power transmission circuit 1720. The amount of the power to be transmitted to the power receiving unit 1750 may be varied according to the variations in the current/voltage applied to the conductive pattern 1724. The sensing circuit 1715 may sense variations in the temperature of the power transmitting unit 1700. According to various embodiments, the sensing circuit 1715 may include at least one of a current/voltage sensor or a temperature sensor.

According to various embodiments, the control circuit 1712 may control the operation of the power transmitting unit 1700. For example, the control circuit 1712 may control the operation of the power transmitting unit 1700 using an algorithm, a program, or an application required for control, stored in the storage circuit 1716. The control circuit 1712 may be implemented in the form of, e.g., a CPU, a microprocessor, or a miniaturized computer. For example, the control circuit 1712 may display, on the display module 1717, the state of the power receiving unit 1750 based on a message received from the power receiving unit 1750 through the communication circuit 1730.

According to various embodiments, the control circuit 1712 may control to wirelessly transmit power to the power receiving unit 1750 through the power transmission circuit 1720. According to various embodiments, the control circuit 1712 may control to wirelessly receive information from the power receiving unit 1750 through the communication circuit 1730.

According to an embodiment, the information received from the power receiving unit 1750 may include at least one of charge configuration information related to the battery status of the power receiving unit 1750, power amount control information related to adjustment of the amount of power transmitted to the power receiving unit 1750, environment information related to the charge environment of the power receiving unit 1750, or time information about the power receiving unit 1750. According to an embodiment, the charge configuration information may be information related to the battery status of the power receiving unit 1750 at the time of wirelessly charging between the power transmitting unit 1700 and the power receiving unit 1750. For example, the charge configuration information may include at least one of the total battery capacity, remaining battery capacity, charge count, battery usage, charging mode, charging scheme, or wireless reception frequency band of the power receiving unit 1750. According to an embodiment, the power amount control information may include information for controlling the initial power amount transmitted according to variations in the amount of power charged to the power receiving unit 1750 during wireless charge between the power transmitting unit 1700 and the power receiving unit 1750. According to an embodiment, the environment information may be information measured for the charging environment of the power receiving unit 1750 by the sensing circuit 1755 of the power receiving unit 1750 and may include at least one of, e.g., temperature data including at least one of the internal or external temperature of the power receiving unit 1750, illuminance data indicating the ambient illuminance (brightness) of the power receiving unit 1750, or sound data indicating the ambient sound (noise) of the power receiving unit 1750. According to an embodiment, the control circuit 1712 may control to generate power, to be transmitted to the power receiving unit 1750, or generate power, based on the charge configuration information among the information received from the power receiving unit 1750. Alternatively, the control circuit 1712 may determine or change the amount of power transmitted to the power receiving unit 1750, based on at least part (e.g., at least one of the power amount control information, environment information, or time information) of the information received from the power receiving unit 1750. Alternatively, the control circuit 1712 may control the matching circuit 1723 to change the impedance.

According to various embodiments, the display module 1717 may display overall information related to the status of the power transmitting unit 1700, environment information, or charging status.

According to various embodiments, the communication circuit 1730 may communicate with the power receiving unit 1750 in a predetermined scheme. The communication circuit 1730 may perform data communication with the communication circuit 1780 of the power receiving unit 1750. For example, the communication circuit 1730 may unicast, multicast, or broadcast signals.

According to an embodiment, the communication circuit 1730 may include at least one of a first communication circuit 1731 that may be, together with the power transmission circuit 1720, implemented as a single piece of hardware to allow the power transmitting unit 1700 to perform communication in an in-band type or a second communication circuit 1732 that may be implemented as hardware different from the power transmission circuit 1720 to allow the power transmitting unit 1700 to perform communication in an out-of-band type.

According to an embodiment, when the communication circuit includes the first communication circuit 1731 that may perform communication in the in-band type, the first communication circuit 1731 may receive the frequency and signal level of the electromagnetic field signal received through the conductive pattern 1724 of the power transmission circuit 1720. The control circuit 1712 may extract the information received from the power receiving unit 1750 by decoding the frequency and signal level of the electromagnetic field signal received through the conductive pattern 1724. Alternatively, the first communication circuit 1731 may apply a signal for information about the power transmitting unit 1700, to be transmitted to the power receiving unit 1750, to the conductive pattern 1724 of the power transmission circuit 1720 (e.g., change the impedance of the load (e.g., the conductive pattern 1724) according to an on/off keying modulation scheme) or add a signal for the information about the power transmitting unit 1700 to the electromagnetic field signal generated as the signal output from the matching circuit 1723 is applied to the conductive pattern 1724, and transmit the information about the power transmitting unit 1700 to the power receiving unit 1750. The control circuit 1712 may control to change the state of connection with at least one of the inductor and capacitor of the matching circuit 1723 through on/off control of the switching device included in the matching circuit 1723 and to output the information about the power transmitting unit 1700.

According to an embodiment, when the communication circuit 1730 includes the second communication circuit 1732 capable of performing communication in the out-of-band type, the second communication circuit 1732 may communicate with the communication circuit 1780 (e.g., the second communication circuit 1782) of the power receiving unit 1750 using, e.g., near-field communication (NFC), Zigbee communication, infrared communication, visible light communication, Bluetooth communication, Bluetooth low energy (BLE) communication scheme, or UWB communication scheme.

The above-described communication scheme of the communication circuit 1730 is merely an example, and the scope of embodiments of the disclosure are not limited to a specific communication scheme performed by the communication circuit 1730.

According to various embodiments, a power receiving unit 1750 (e.g., a wireless power receiving device) may include a power reception circuit 1770, a control circuit 1752, a communication circuit 1780, a sensing circuit 1755, and/or a display module 1757.

According to various embodiments, the power reception circuit 1770 may receive power from the power transmission circuit 1720 of the power transmitting unit 1700. The power reception circuit 1770 may be implemented in the form of an embedded battery or in the form of a power receiving interface so that it receives power from the outside. The power reception circuit 1770 may include a matching circuit 1771, a rectification circuit 1772, a regulation circuit 1773, a battery 1775, and/or a conductive pattern 1776.

According to various embodiments, the power reception circuit 1770 may receive, through the conductive pattern 1776, wireless power in the form of an electromagnetic wave, generated in response to the current/voltage applied to the conductive pattern 1724. For example, the power reception circuit 1770 may receive power using the induced electromotive force formed at the conductive pattern 1724 of the power transmission circuit 1720 and the conductive pattern 1776 of the power reception circuit 1770.

According to various embodiments, a matching circuit 1771 may perform impedance matching. For example, the power transmitted through the conductive pattern 1724 of the power transmitting unit 1700 may be transferred to the conductive pattern 1776, forming an electromagnetic field. According to various embodiments, the matching circuit 1771 may adjust the frequency band of the formed electromagnetic field (e.g., electromagnetic field signal) by adjusting impedance. According to various embodiments, the matching circuit 1771 may control to allow the input power received from the power transmitting unit 1700 through the conductive pattern 1776 to have high efficiency and high output by such impedance adjustment. According to various embodiments, the matching circuit 1771 may adjust impedance based on the control of the control circuit 1752. The matching circuit 1771 may include at least one of an inductor (e.g., coil), a capacitor, or a switching device. The control circuit 1752 may control the state of connection with at least one of the inductor or capacitor through the switching device, thereby performing impedance matching.

According to various embodiments, the rectification circuit 1772 may rectify the wireless power received to the conductive pattern 1776 into a DC form and may be implemented in the form of, e.g., a bridge diodes.

According to various embodiments, the regulation circuit 1773 may convert the rectified power to have a set gain. The regulation circuit 1773 may include a DC/DC converter (not shown). For example, the regulation circuit 1773 may convert the rectified power so that the voltage at the output end is 5V. Alternatively, a minimum value or maximum value of the voltage that may be applied may be set at the front end of the regulation circuit 1773.

According to various embodiments, the switching circuit 1774 may connect the regulation circuit 1773 and the battery 1775. According to various embodiments, the switching circuit 1774 may maintain the on/off state according to the control of the control circuit 1752.

According to various embodiments, the battery 1775 may receive, and be charged with, the power input from the regulation circuit 1773.

According to various embodiments, the sensing circuit 1755 may sense a change in the state of the power received by the power receiving unit 1750. For example, the sensing circuit 1755 may periodically or aperiodically measure the current/voltage value received by the conductive pattern 1776 through a predetermined current/voltage sensor (not shown). According to various embodiments, the power receiving unit 1750 may calculate the amount of the power received by the power receiving unit 1750 based on the current/voltage measured through the predetermined current/voltage sensor (not shown). According to various embodiments, the sensing circuit 1755 may sense a change in the charging environment of the power receiving unit 1750. For example, the sensing circuit 1755 may periodically or aperiodically measure at least one of the internal temperature or external temperature of the power receiving unit 1750 through a predetermined temperature sensor (not shown).

According to various embodiments, the display module 1757 may display the overall information related to the charging status of the power receiving unit 1750. For example, the display module 1757 may display at least one of the total battery capacity, remaining battery capacity, battery charge amount, battery usage, or expected charge time of the power receiving unit 1750.

According to various embodiments, the communication circuit 1780 may communicate with the power transmitting unit 1700 in a predetermined scheme. The communication circuit 1780 may perform data communication with the communication circuit 1730 of the power transmitting unit 1700. According to various embodiments, the communication circuit 1780 may operate in the same or similar manner to the communication circuit 1730 of the power transmitting unit 1700.

According to various embodiments, the communication circuit 1780 may transmit, to the power transmitting unit 1700, charge configuration information for receiving a desirable amount of power based on the information related to the battery status of the power receiving unit 1750 through the communication circuit 1780. For example, upon identifying the power transmitting unit 1700 capable of transmitting wireless power, the control circuit 1752 may transmit, to the power transmitting unit 1700 through the communication circuit 1780, the charge configuration information for receiving a desirable amount of power based on at least one of the total battery capacity, remaining battery capacity, battery usage, charging mode, charging scheme, or wireless reception frequency band of the power receiving unit 1750.

According to various embodiments, the communication circuit 1780 may transmit, to the power transmitting unit 1700 through the communication circuit 1780, power amount control information for controlling the amount of power received from the power transmitting unit 1700 according to a change in the amount of power charged to the power receiving unit 1750.

According to various embodiments, the control circuit 1752 may transmit environment information according to the change in charging environment of the power receiving unit 1750 to the power transmitting unit 1700 through the communication circuit 1780. For example, if the temperature data value measured by the sensing circuit 1755 is a set temperature reference value or more, the control circuit 1752 may transmit the measured temperature data to the power transmitting unit 1700.

Although FIG. 17 illustrates that the power transmitting unit 1700 and the power receiving unit 1750 respectively include the power transmission circuit 1720 and the power reception circuit 1770, the power transmitting unit 1700 and the power receiving unit 1750 each may include both the power transmission circuit 1720 and the power reception circuit 1770. Accordingly, according to various embodiments, the power transmitting unit 1700 and the power receiving unit 1750 may perform all of the functions of the power transmitting device and the power receiving device.

A wireless power transmitting device according to any one of various embodiments includes: a transistor configured to output a first signal corresponding to a set operating frequency, based on an input signal and a driving voltage; a matching circuit connected with the transistor; a transmission coil connected with the matching circuit; an LC resonance circuit connected in parallel between the transistor and the matching circuit and configured to transfer a second signal corresponding to at least one harmonic frequency of the operating frequency to the transmission coil; and an impedance sensing circuit connected with the LC resonance circuit and configured to sense a load impedance of the wireless power transmitting device based on the second signal corresponding to the at least one harmonic frequency transferred through the LC resonance circuit. The matching circuit is configured to provide impedance matching with the sensed load impedance by adjusting an impedance of the matching circuit or an impedance of the transmission coil According to various embodiments, the second signal corresponding to the at least one harmonic frequency may include at least one harmonic frequency signal among a second harmonic frequency signal to a 20th harmonic frequency signal.

According to various embodiments, the LC resonance circuit may include at least one coil and at least one capacitor connected in series with the at least one coil. The impedance sensing circuit may be connected between the at least one coil and the at least one capacitor.

According to various embodiments, the impedance sensing circuit may include a first capacitor connected in parallel with at least one capacitor of the LC resonance circuit; and a first inductor connected in series to the first capacitor. The load impedance may be sensed based on a first voltage between two ends of the first inductor.

According to various embodiments, the first voltage between the two ends of the first inductor may be determined based on a second voltage between two ends of the LC resonance circuit for each harmonic frequency of the at least one harmonic frequency and a gain of the impedance sensing circuit.

According to various embodiments, the impedance sensing circuit may further include an envelope detector connected in parallel between the first capacitor and the first inductor and configured to detect a peak value of the first voltage between the two ends of the first inductor. The load impedance may be sensed based on the peak value detected by the envelope detector.

According to various embodiments, the impedance sensing circuit may further include an error detector connected with the envelope detector. The error detector may be configured to receive an output signal of the envelope detector through a first input terminal thereof and a reference voltage signal through a second input terminal thereof and output an error signal corresponding to a difference between the output signal of the envelope detector and the reference voltage signal.

According to various embodiments, the wireless power transmitting device may be configured to receive the error signal from the error detector internally and adjust the impedance of the transmission coil based on the received error signal.

According to various embodiments, the impedance sensing circuit may be configured to sense the load impedance based on a value obtained by normalizing the first voltage between the two ends of the first inductor with the driving voltage.

According to various embodiments, the impedance sensing circuit may further include a controller configured to receive a sensing value corresponding to the sensed load impedance.

According to various embodiments, the transmission coil may further include a variable coil connected in series to the matching circuit. The controller may be configured to control the variable coil based on the sensing value.

According to various embodiments, the wireless power transmitting device may further comprise a variable capacitor connected to the matching circuit. The controller may be configured to control the variable capacitor based on the sensing value.

According to various embodiments, the variable capacitor may include at least one capacitor and at least one switch connected in series with the at least one capacitor. The controller may be configured to control the at least one switch to adjust a capacitance of the variable capacitor.

A wireless power transmission method of a wireless power transmitting device according to any one of various embodiments includes: outputting a first signal corresponding to a set operating frequency, based on an input signal and a driving voltage, by a transistor; transferring a second signal corresponding to at least one harmonic frequency of the operating frequency, provided by an LC resonance circuit connected in parallel between the transistor and a matching circuit; forming a magnetic field based on the second signal, by a transmission coil; sensing a load impedance of the wireless power transmitting device based on the second signal corresponding to the at least one harmonic frequency transferred through the LC resonance circuit, by an impedance sensing circuit connected with the LC resonance circuit; and providing impedance matching with the sensed load impedance by adjusting an impedance of the matching circuit or an impedance of the transmission coil.

According to various embodiments, the second signal corresponding to the at least one harmonic frequency may include at least one harmonic frequency signal among a second harmonic frequency signal to a 20th harmonic frequency signal.

According to various embodiments, sensing the load impedance may include sensing the load impedance based on a first voltage between two ends of the LC resonance circuit.

According to various embodiments, the sensing the load impedance may include sensing the load impedance based on a second voltage between two ends of a first inductor, of a first capacitor and the first inductor connected in parallel between at least one coil and at least one capacitor included in the LC resonance circuit.

According to various embodiments, the sensing the load impedance may include sensing the load impedance based on a peak value of the second voltage between the two ends of the first inductor.

According to various embodiments, the method may further include outputting an error signal based on a result of comparison between the peak value and a reference voltage signal.

According to various embodiments, the method may further include adjusting a load impedance of the transmission coil based on the output error signal.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A wireless power transmitting device comprising,
a transistor configured to output a first signal corresponding to a set operating frequency, based on an input signal and a driving voltage;
a matching circuit connected with the transistor;
a transmission coil connected with the matching circuit;
an LC resonance circuit connected in parallel between the transistor and the matching circuit and configured to transfer a second signal corresponding to at least one harmonic frequency of the operating frequency to an impedance sensing circuit; and
the impedance sensing circuit connected with the LC resonance circuit and configured to sense a load impedance of the wireless power transmitting device based on the second signal corresponding to the at least one harmonic frequency transferred through the LC resonance circuit,
wherein the matching circuit is configured to adjust an impedance of the matching circuit or an impedance of the transmission coil based on the sensed load impedance.

2. The wireless power transmitting device of claim 1, wherein the second signal corresponding to the at least one harmonic frequency includes at least one harmonic frequency signal among a second harmonic frequency signal to a 20th harmonic frequency signal.

3. The wireless power transmitting device of claim 1, wherein the LC resonance circuit includes at least one coil and at least one capacitor connected in series with the at least one coil, and
wherein the impedance sensing circuit is connected between the at least one coil and the at least one capacitor.

4. The wireless power transmitting device of claim 1, wherein the impedance sensing circuit includes,
a first capacitor connected in parallel with at least one capacitor of the LC resonance circuit; and
a first inductor connected in series to the first capacitor, and
wherein the load impedance is sensed based on a first voltage between two ends of the first inductor.

5. The wireless power transmitting device of claim 4, wherein the first voltage between the two ends of the first inductor is determined based on a second voltage between two ends of the LC resonance circuit for each harmonic frequency of the at least one harmonic frequency and a gain of the impedance sensing circuit.

6. The wireless power transmitting device of claim 4, wherein the impedance sensing circuit further includes,
an envelope detector connected in parallel between the first capacitor and the first inductor and configured to detect a peak value of the first voltage between the two ends of the first inductor, and
wherein the load impedance is sensed based on the peak value detected by the envelope detector.

7. The wireless power transmitting device of claim 6, wherein the impedance sensing circuit further includes an error detector connected with the envelope detector, and
wherein the error detector is configured to receive an output signal of the envelope detector through a first input terminal of the error detector and a reference voltage signal through a second input terminal of the error detector and output an error signal corresponding to a difference between the output signal of the envelope detector and the reference voltage signal.

8. The wireless power transmitting device of claim 7, wherein the wireless power transmitting device is configured to receive the error signal from the error detector internally and adjust the impedance of the transmission coil based on the received error signal.

9. The wireless power transmitting device of claim 4, wherein the impedance sensing circuit is configured to sense the load impedance based on a value obtained by normalizing the first voltage between the two ends of the first inductor with the driving voltage.

10. The wireless power transmitting device of claim 1, wherein the impedance sensing circuit further comprises a controller configured to receive a sensing value corresponding to the sensed load impedance.

11. The wireless power transmitting device of claim 10, wherein the transmission coil includes a variable coil connected in series to the matching circuit,
wherein the controller is configured to control the variable coil based on the sensing value.

12. The wireless power transmitting device of claim 10, further comprising a variable capacitor connected to the matching circuit,
wherein the controller is configured to control the variable capacitor based on the sensing value.

13. The wireless power transmitting device of claim 12, wherein the variable capacitor includes at least one capacitor and at least one switch connected in series with the at least one capacitor, and
wherein the controller is configured to control the at least one switch to adjust a capacitance of the variable capacitor.

14. A wireless power transmission method of a wireless power transmitting device, comprising,
outputting a first signal corresponding to a set operating frequency, based on an input signal and a driving voltage, by a transistor;
transferring, to an impedance sensing circuit, a second signal corresponding to at least one harmonic frequency of the operating frequency, provided by an LC resonance circuit connected in parallel between the transistor and a matching circuit;
sensing a load impedance of the wireless power transmitting device based on the second signal corresponding to the at least one harmonic frequency transferred through the LC resonance circuit, by the impedance sensing circuit connected with the LC resonance circuit, and adjusting an impedance of the matching circuit or an impedance of the transmission coil based on the sensed load impedance.

15. The wireless power transmitting method of claim 14, wherein the second signal corresponding to the at least one harmonic frequency includes at least one harmonic frequency signal among a second harmonic frequency signal to a 20th harmonic frequency signal.

16. The wireless power transmission method of claim 14, wherein sensing the load impedance includes:
  sensing the load impedance based on a first voltage between two ends of the LC resonance circuit.

17. The wireless power transmission method of claim 14, wherein sensing the load impedance includes:
  sensing the load impedance based on a second voltage between two ends of a first inductor, of a first capacitor and the first inductor connected in parallel between at least one coil and at least one capacitor included in the LC resonance circuit.

18. The wireless power transmission method of claim 17, wherein sensing the load impedance includes:
  sensing the load impedance based on a peak value of the second voltage between the two ends of the first inductor.

19. The wireless power transmission method of claim 18, further comprising:
  outputting an error signal based on a result of comparison between the peak value and a reference voltage signal.

20. The wireless power transmission method of claim 19, further comprising:
  adjusting the impedance of the transmission coil based on the output error signal.

* * * * *